(12) United States Patent
Nishimura

(10) Patent No.: US 6,233,169 B1
(45) Date of Patent: May 15, 2001

(54) SIGNAL STORING CIRCUIT SEMICONDUCTOR DEVICE, GATE ARRAY AND IC-CARD

(75) Inventor: Kiyoshi Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/434,889

(22) Filed: Nov. 5, 1999

(30) Foreign Application Priority Data

Nov. 6, 1998 (JP) .................................................. 10-315806

(51) Int. Cl.[7] .................................................... G11C 11/22
(52) U.S. Cl. ............................................................ 365/145
(58) Field of Search ................................... 365/145, 149, 365/154, 156

(56) References Cited

U.S. PATENT DOCUMENTS

| | | | |
|---|---|---|---|
| 5,603,043 | * | 2/1997 | Taylor et al. ............................... 712/1 |
| 5,896,042 | * | 4/1999 | Nishimura et al. ...................... 326/38 |
| 5,905,671 | * | 5/1999 | DeVilbiss .............................. 365/145 |
| 5,949,706 | * | 9/1999 | Chang et al. .......................... 365/156 |

* cited by examiner

Primary Examiner—Trong Phan
(74) Attorney, Agent, or Firm—Merchant & Gould P.C.

(57) ABSTRACT

It is an object to provide signal storing circuits and related devices capable of storing resulting data even when the power supply thereto is suspended, and to provide the signal storing circuit which consumes less power. A logic processing circuit 56 comprises a combined logic block CB and a latching block LT. The latching block LT includes a line 104 for passing the resulting data OUT outputted by the logic block CB. A circular signal path (feedback loop) including a line 106 and another line 108 overlaps a part of the line 104. An inverter circuit INV2 made of a ferroelectric transistor is provided to the line 108. In this way, the resulting data OUT existing on the line 104 can be stored in ferroelectrical manner and the data right before the shut-off of the power supply can be reproduced on the line 104 with the recovery of the power supply. In order to suppress the power consumption, a power control portion 55 switching the power supplied to the latching block LT is provided to the processing circuit 56.

22 Claims, 27 Drawing Sheets

| A | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|
| B | 0 | 0 | 0 | 0 | 1 | 1 | 1 | 1 | 0 | 0 | 0 | 0 | 1 | 1 | 1 | 1 |
| C | 0 | 0 | 1 | 1 | 0 | 0 | 1 | 1 | 0 | 0 | 1 | 1 | 0 | 0 | 1 | 1 |
| D | 0 | 1 | 0 | 1 | 0 | 1 | 0 | 1 | 0 | 1 | 0 | 1 | 0 | 1 | 0 | 1 |
| OUT | 0 | 1 | 1 | 1 | 1 | 1 | 0 | 0 | 0 | 0 | 0 | 0 | 0 | 0 | 0 | 0 |

SIGNAL STORING CIRCUIT SEMICONDUCTOR DEVICE, GATE ARRAY AND IC-CARD

CROSS REFERENCE TO RELATED APPLICATIONS

All the contents disclosed in Japanese Patent Application No. H10-315806 (filed on Nov. 6, 1998), including specification, claims, drawings and abstract and summary is incorporated herein by reference in its entirety.

BACKGROUND OF THE INVENTION

1. Field of the Invention

The present invention relates to signal storing circuits and devices related thereto, more specifically to the signal storing circuits and devices related thereto using ferroelectrics.

2. Description of the Related Art

IC-cards are used for credit cards and for identification tags in distributing systems. Recently, IC-cards mounting logic LSIs (large scale integrated circuit) thereon as well as installing micro-computers therein are commercially available. A circuit shown in FIG. 26 is known as a sequence logic processing circuit used for the logic LSIs and the microcomputers.

The logic processing circuit 2 shown in FIG. 26 comprises a combined logic block CB including NAND circuits and/or OR circuits and a latching block LT latching an output of the combined logic block CB. The combined logic block CB performs a predetermined logic operation to an input data IN provided thereto, and outputs a resulting data OUT therefrom. The latching block LT latches the resulting data OUT at the positive edge (Low-to-high transition) or the negative edge (High-to-low transition) of a clock pulse Cp. The data OUT thus latched therein is outputted as an output data Q.

With the logic processing circuit 2, the data OUT latched can be outputted within a duration equivalent to a time period in which upcoming clock pulse Cp is detected by latching the data OUT at the positive edge (or negative edge) of the clock pulse Cp. In this way, a stable output can be obtained by eliminating noises from the resulting data.

Sequential processing having a high reliability and other related using a combination of a plurality of the logic processing circuits 2 can perform processing.

The conventional processing circuit 2 described above, however, has the following problems to be solved. An adequate voltage must be applied to the circuit 2 all the time in order to hold the data being processed.

Data being processed under sequential processing and that stored in a memory are completely erased when the power supply is shut off by an accident. The data can not be recovered even after the recovery of the power supply. In order to recover the data into the original one just before the accident, another sequential processing must be performed all over again from its beginning. It consumes much time to perform the sequential processing for every accident, and the data erase cause serious damages on the reliability in processing.

The power supply would be in unstablized when the circuit is used for a non-contact type IC card because the power is supplied thereto through radio waves. Suspension in the power supply makes the processing difficult especially when a greater amount of data need to be processed under the real-time basis.

In order to suppress the power consumption of the circuit, a low-power consumption type-latching block LT shown in FIG. 27 is proposed. This is achieved by utilizing transistor(s) having a high threshold voltage, which lower the power consumption.

A circuit 4 having a low threshold voltage comprises inverter circuits INV0 and INV1 both including low threshold transistors, which can operate fast in operating speed but consume much power. A circuit 6 having a high threshold voltage, on the contrary, comprises inverter circuits inverter circuits INV2 and INV3 both including high threshold transistors which are operated slowly in operating speed but consume not much power.

A power control part 8 supplies the power to the circuit 4 when the circuit 2 is in operation, and the control part 8 suspends the power supply to the circuit 4 when the circuit 2 is in stand-by State. In this way, the resulting data OUT is outputted through the inverter circuits INV0 and INV1 both can operate fast in operating speed during the operating-State, and the data OUT is stored in the inverter circuits INV2 and INV3 both consumes not much power during the stand-by State. It is, therefore, preferred for the circuit 2 to store the data OUT in such a way.

Although, the low-power consumption type-latching block LT shown in FIG. 27 during the Stand-by State consumes a relatively smaller power, it still consumes the power.

SUMMARY OF THE INVENTION

It is an object of the present invention to overcome the above mentioned problems on a prior art logic processing circuit and to provide signal storing circuits and related devices capable of storing resulting data even when the power supply thereto is suspended, and to provide the signal storing circuit which consumes less power.

In accordance with characteristics of the present invention, there is provided a signal storing circuit storing a signal therein for a predetermined time period, the circuit comprises:

a signal path for passing the signal therethrough; and a ferroelectric memorizing portion connected to the signal path and holding a polarization-State corresponding to a signal on the signal path in an operating-State even after shut off the circuit while reproducing the signal on the signal path in accordance with the polarization-State thus held therein when the circuit is again in operation.

A word "ferroelectric memorizing portion" used in claims represents a portion, which stores data, by using hysteresis of ferroelectrics. In a concrete form, the ferroelectric memorizing portion includes a ferroelectric transistor and a ferroelectric capacitor, not only those, a circuit or equivalents combining these may be included. An inverter circuit INV2 shown in FIG. 1 forms the memorizing portion.

Further, another words "a ferroelectric transistor" used in claims represents a transistor using ferroelectrics such as a transistor having a structure so called MFMIS and an MFS-structured transistor both of which will be described subsequently. In the preferred embodiments, transistors NT and PT shown in FIG. 4 form the ferroelectric transistor.

While the novel features of the invention are set forth in a general fashion, both as to organization and content, along with other objects and features thereof from the following detailed description taken in conjunction with the drawings.

DETAILED DESCRIPTION OF THE PREFERRED EMBODIMENTS

Figure 1:
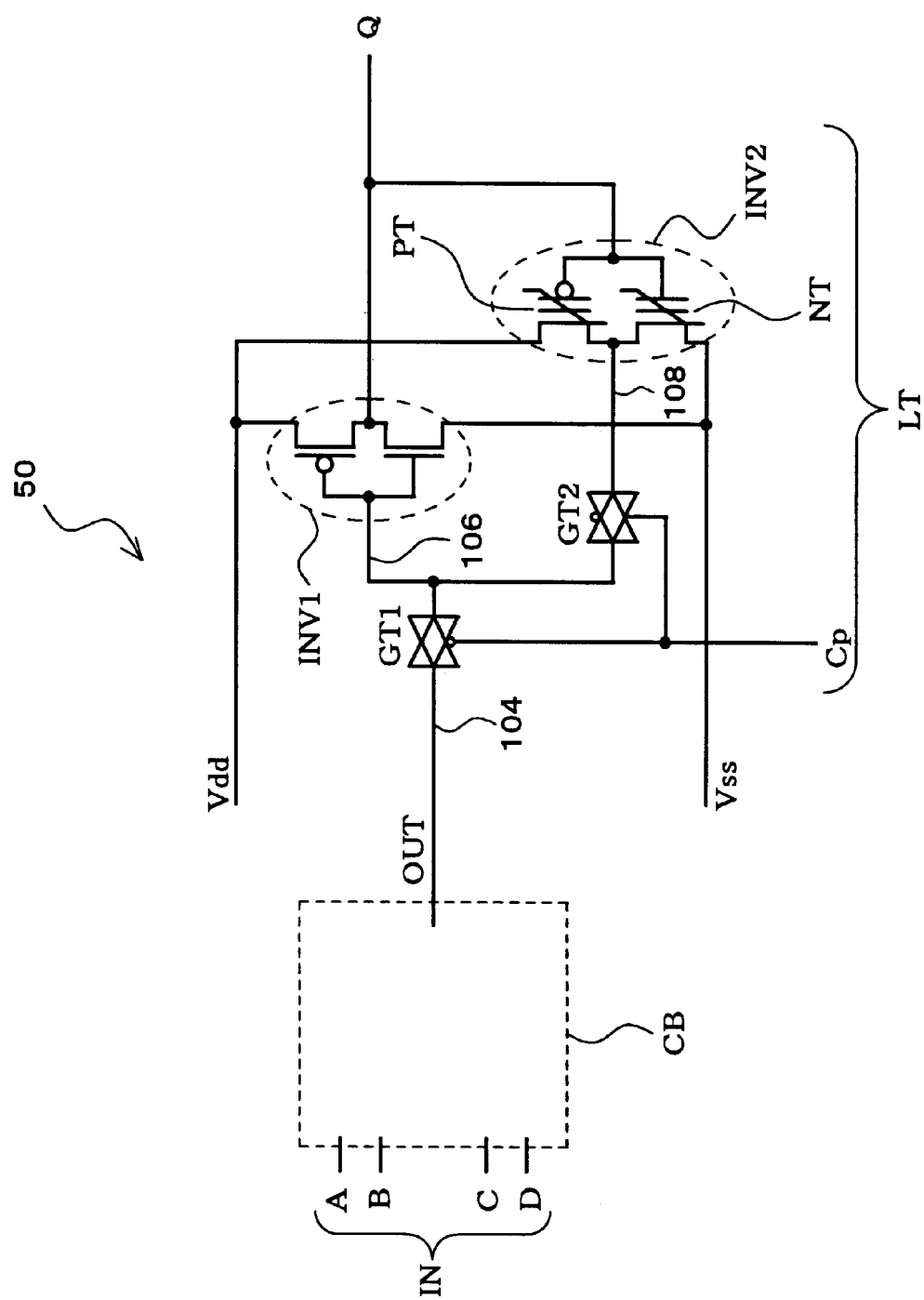
FIG. 1 is a circuit diagram of a logic processing circuit 50 used in one embodiment of a semiconductor device according to the present invention.

FIG. 1 is a circuit diagram of a logic processing circuit 50 used in one embodiment of a semiconductor device according to the present invention. The processing circuit 50 comprises a combined logic block CB forming a combined circuit and a latching block LT serving as a signal storing circuit.

The combined logic block CB includes the NAND gates, the OR gates, other kinds of gates, or equivalents thereof and outputs a resulting data OUT after performing a predetermined logic operation and other operation(s) to an inputted data IN (for example, a total of four inputs such as inputs "A", "B", "C" and "D" through input terminals).

The latching block LT includes a line 104 forming a signal path for passing the resulting data OUT. Both a line 106 forming a main signal path and another line 108 serving as a feedback path overlap on a part of the line 104. A circular signal path is composed of the line 106 and the line 108.

A transmission gate GT1 forming an input gate carrying out switching operations in accordance with a clock pulse Cp applied as a gate control signal, is provided to the line 104 at a position closer to the input terminals than the position connecting the feedback path thereto. The transmission gate GT1 is designed so that it is turned into OFF and ON respectively when the clock pulse Cp is in "High" and "Low".

Further, another transmission gate GT2 forming a feedback gate is provided to the line 108. The transmission gate GT2, unlike to the transmission gate GT1, is designed so that it is turned into ON and OFF respectively when the clock pulse Cp is in "High" and "Low".

In this way, power consumption of the circuit 50 can be decreased during non-latching State thereof by shut the line 108 off as a result of providing the transmission gate GT2 thereto.

To the line 106, an inverter circuit INV1 is provided. The inverter circuit INV1 is a CMOS inverter circuit in which a P channel MOSFET and an N channel MOSFET are connected in series.

Transmission speed of signals in the circuit 50 can be accelerated during the non-latching State thereof not by providing a ferroelectric transistor to the line 106 forming the main signal path.

Figure 4:
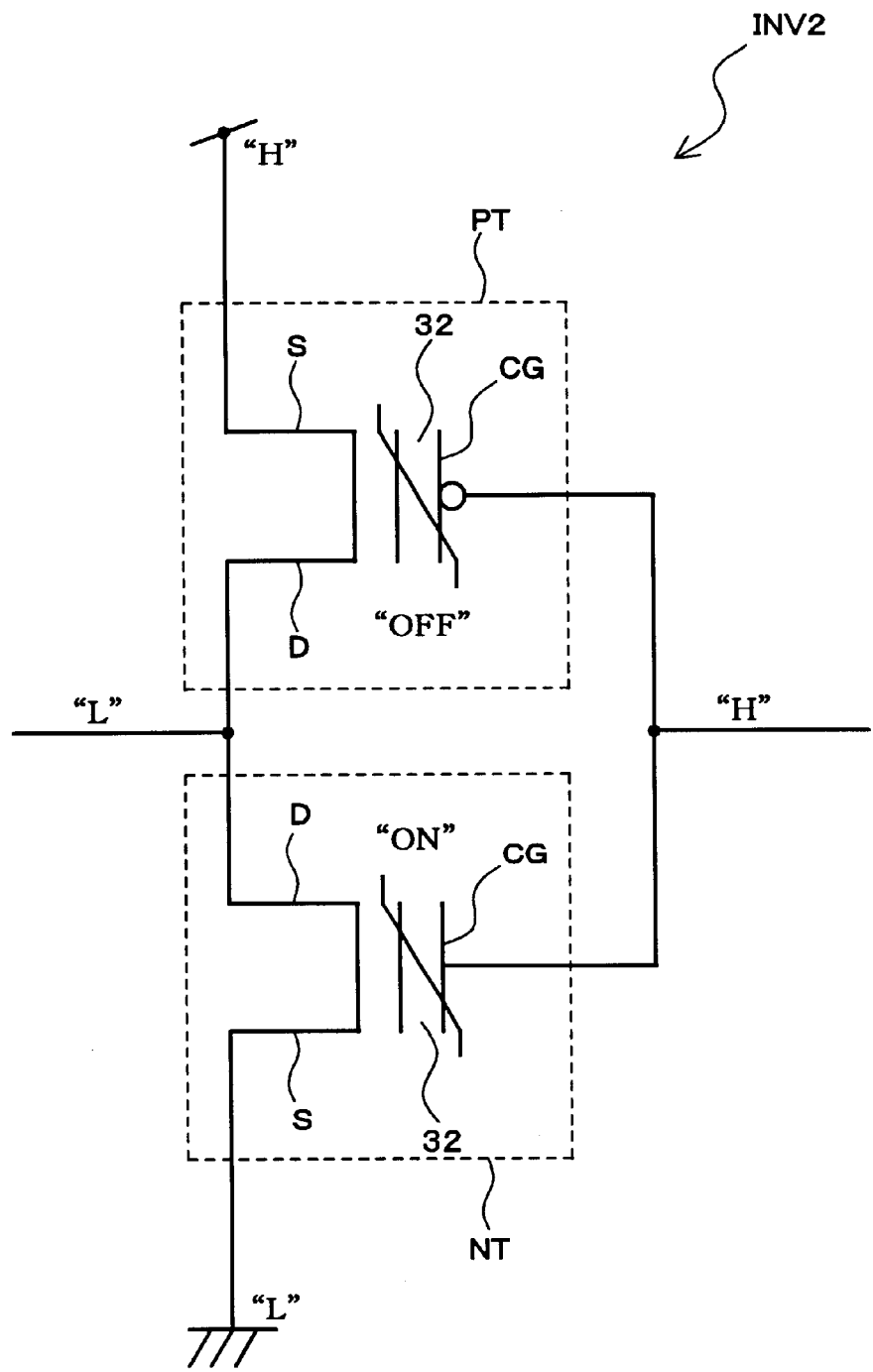
FIG. 4 is a circuit diagram of an inverter circuit INV2 when a clock pulse Cp. is in the positive edge (Low-to-high transition)

On the contrary, an inverter circuit INV2 forming a ferroelectric memorizing portion is provided to the line 108. The inverter circuit INV2 is also a CMOS inverter circuit similar to the inverter circuit INV1, but the circuit INV2 is different from the circuit INV1 from a point of view that the transistors PT of P-channel MOSFET and NT of N-channel MOSFET included therein are both ferroelectric transistors as shown in FIG. 4.

Both the transistor NT and the transistor PT are ferroelectric transistors having a structure so called MFMIS (a metal layer, a ferroelectric layer, another metal layer, an insulation layer, and a silicon layer are formed one after another from the top in succession).

Figure 3A:
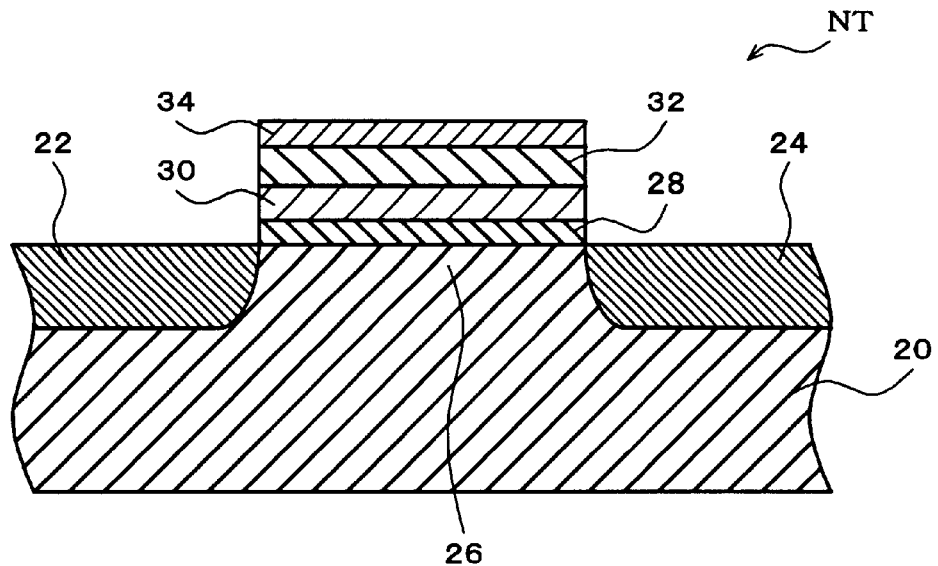
FIG. 3A is a sectional view illustrating the structure of a transistor NT that is used in the processing circuit 50.

FIG. 3A is a sectional view illustrating the structure of the transistor NT depicted in FIG. 1. A source region 22 and a drain region 24 both of n-type (first conductive type) semiconductor are formed in a silicon substrate 20 of p-type, which forms a semiconductor substrate. On a channel formation region 26 of a p-type (second conductive type) semiconductor, an insulation layer 28 made of silicon oxide ($SiO_2$) is formed. A lower conductive layer (a first conductive layer) 30 is a layer formed sequentially comprising in succession of a poly-silicon (Poly-Si) layer, an iridium oxide ($IrO_2$) layer, and an iridium (Ir) layer formed on the insulation layer 28.

A ferroelectric layer 32 made of PZT and the like is formed on the lower conductive layer 30. Polarization-States corresponding to the ON/OFF-State of the transistor NT are held in the ferroelectric layer 32 as will be described subsequently.

An upper conductive layer (a second conductive layer) 34 made both of an iridium oxide ($IrO_2$) layer and an iridium (Ir) layer formed in that order is located on the ferroelectric layer 32.

The insulation layer 28 can also be formed with silicon nitride (SiN) or the like instead of the layers stated above. Further, the lower conductive layer 30 and the upper conductive layer 34 can be formed with oxide conductive materials such as ruthenium oxide (RuOx), indium tin oxide (ITO) or metals such as platinum (Pt), lead (Pb), gold (Au), silver (Ag), aluminum (Al), nickel (Ni) and the like.

Figure 3B:
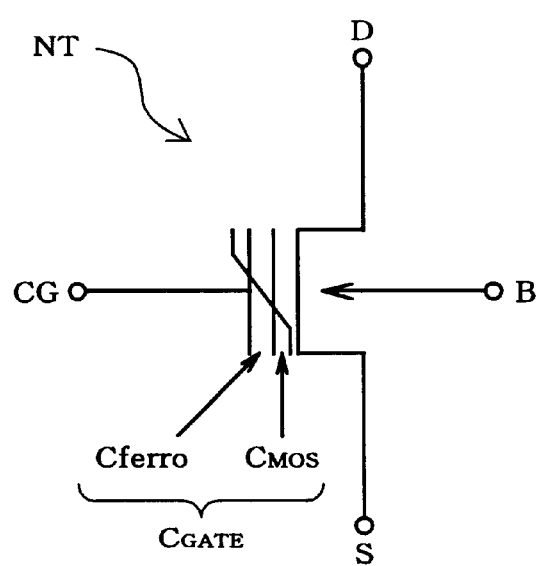
FIG. 3B is a view illustrating a schematic symbol of the transistor NT which in FIG. 3A.

FIG. 3B is a view illustrating a schematic symbol of the transistor NT shown in FIG. 3A. A control gate electrode CG is connected to the upper conductive layer 34. The lower conductive layer 30 is made under a floating-State because no electrodes are connected thereto. A source electrode S and a drain electrode D are respectively connected to the source region 22 and the drain region 24.

The control gate electrode CG (an input terminal of the inverter circuit INV2) and the drain electrode D (an output terminal of the inverter circuit INV2) are connected respectively to an output terminal of the inverter circuit INV1 shown in FIG. 1 and the transmission gate GT2, and the source electrode S is grounded.

Both the transistors NT and PT have the same structures except that one of them is an N channel type MOSFET and the other is a P channel type MOSFET. In other words, the transistor PT is also a ferroelectric transistor having a structure so called MFMIS structure.

Resulting data outputted by the logic block CB is inputted to the latching block LT via the transmission gate GT1, and the data thus inputted is inverted with the inverter INV1, and the data is again inverted with the inverter INV2 (that is, back to original data). The data thus re-inverted is inputted again to the inverter circuit INV1. In other words, a feedback circuit including the inverter circuit INV2 accomplishes stabilization in data storing. The output of the inverter circuit INV1 becomes the output Q of the latching block LT.

Figure 27:
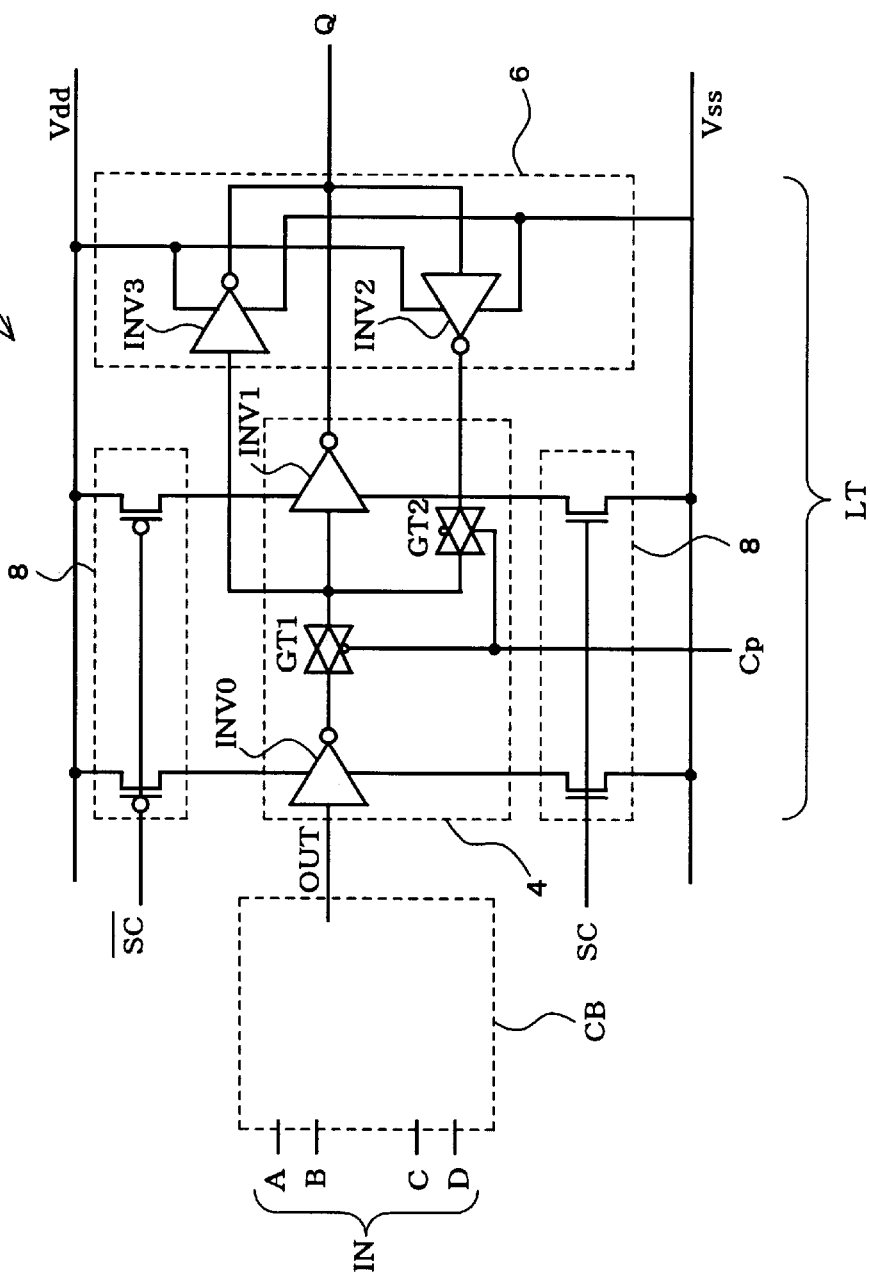
FIG. 27 is a circuit diagram showing one practical example of the logic processing circuit 2 using a low-power consumption type-latching block LT.

The operation of the latching block LT is similar to that of the prior art latching block LT depicted in FIG. 27, but it is different from the prior art latching block in view of holding data even when the power supply is shut off. Unlike to the prior art latching block, the resulting data OUT is latched in the latching block LT when a clock pulse Cp is at a positive edge (Low-to-high transition) in this embodiment.

Figure 2:
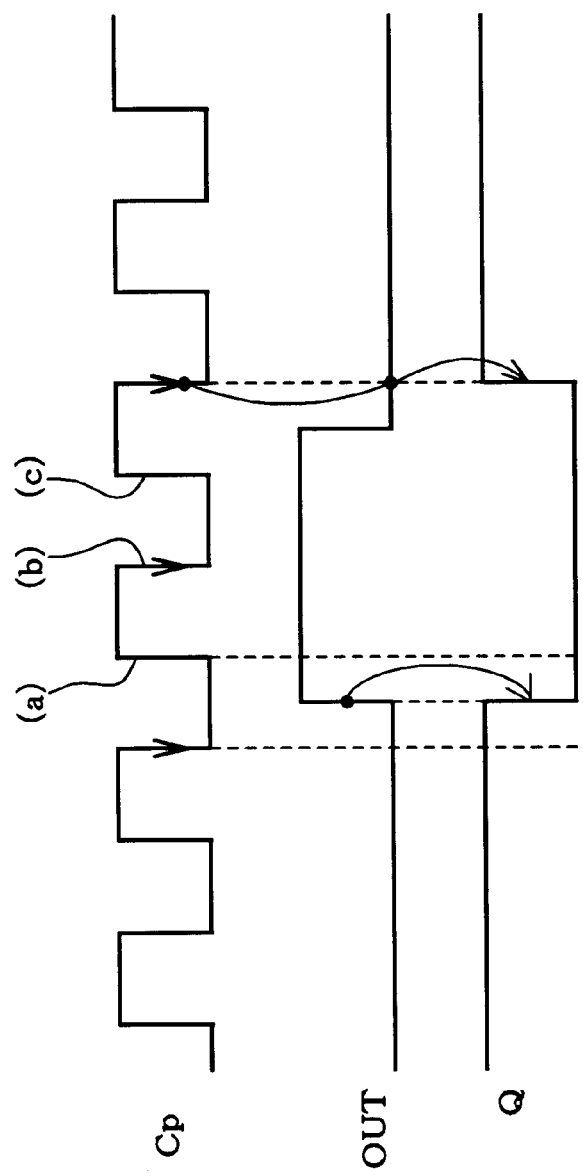
FIG. 2 is a timing chart for describing the operations of a latching block LT in the logic processing circuit 50.

Detailed operations of the latching block LT will be described with reference to timing chart shown in FIG. 2. The transmission gates GT1 and GT2 are respectively turned into OFF-State and ON-State when the clock pulse Cp becomes "High"-State from "Low"-State (see FIG. 2(a)). In this way, data corresponding to the resulting data OUT (the value of an output data Q is equivalent to an inverted value of the resulting data OUT) at the positive edge (Low-to-high transition) is latched to the latching block LT while outputting the data as an output data Q. The data corresponding to the resulting data thus latched is outputted within a duration in which the clock-pulse Cp is in "High"-State.

Subsequently, the transmission gates GT1 and GT2 are respectively turned into ON-State and OFF-State when the clock pulse Cp becomes "Low"-State from "High"-State (see FIG. 2(b)). As a result, data corresponding to the current resulting data OUT (the value of an output data Q is equivalent to an inverted value of the resulting data OUT) is outputted as it is.

Next, the transmission gates GT1 and GT2 are respectively turned into OFF-State again and ON-State when the clock pulse Cp becomes "High"-State from "Low"-State (see FIG. 2(c)). In this way, data corresponding to the resulting data OUT (the value of an output data Q is equivalent to an inverted value of the resulting data OUT) at the positive edge (Low-to-high transition) is latched to the latching block LT while outputting the data as an output data Q.

As a result of using the latching block LT, the data corresponding to the resulting data OUT thus latched can be outputted within a duration in which the clock-pulse Cp is in "High"-State by latching data at the positive edge of the clock pulse Cp. Consequently, stabilized outputs may be obtained by eliminating noises as a result of using the output data Q outputted within a duration in which the clock-pulse Cp is in "High"-State even when noises are contained in the resulting data OUT outputted from the logic block CB.

Figure 26:
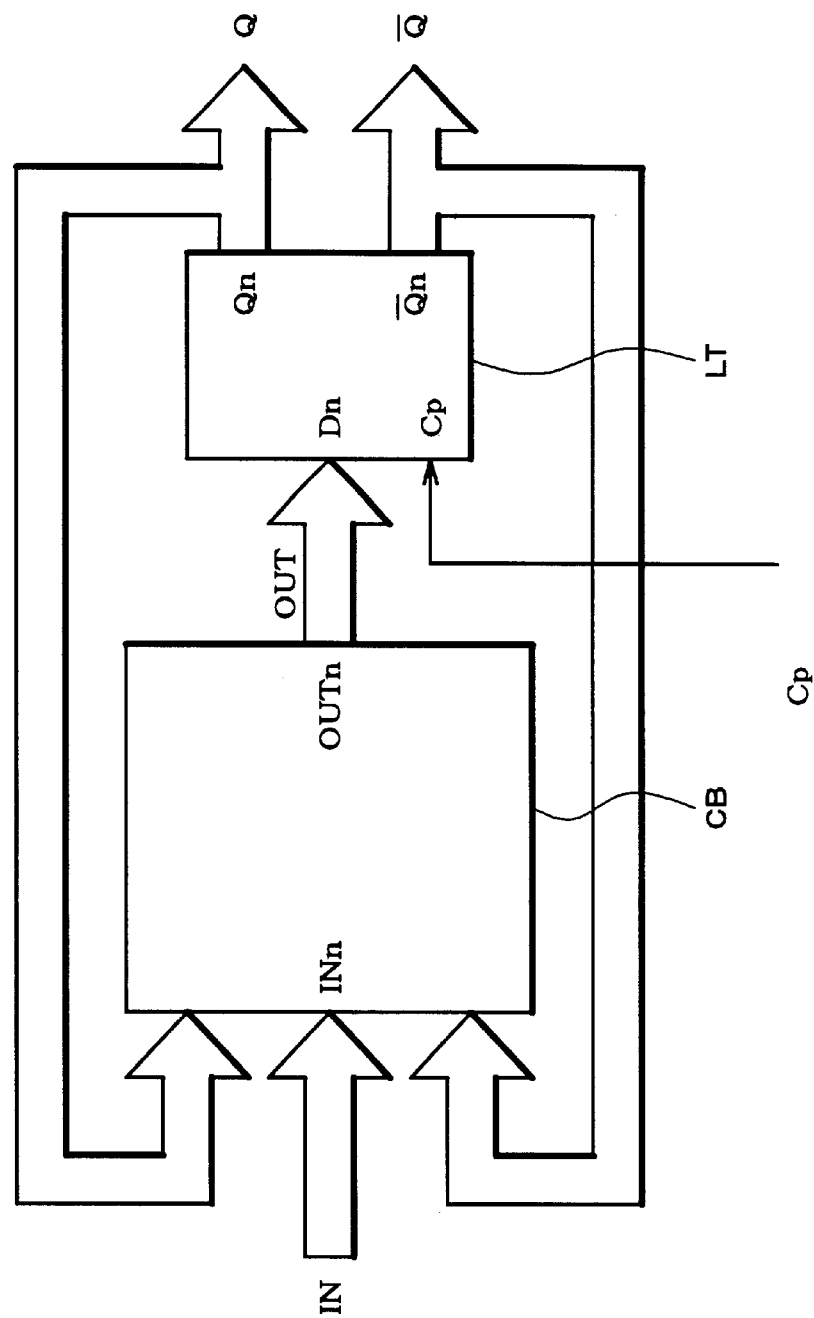
FIG. 26 is a block diagram illustrating a prior art logic processing circuit 2.

As described above, the latching block LT in the processing circuit 50 holds the data therein even when the power supply is shut off, that is different from the prior art latching block LT provided in the circuit 2 shown in FIG. 26. The operations carried out for data holding and data reproduction will be described hereunder.

Data at right before a clock pulse Cp becoming "High"-State from "Low"-State, that is, the data corresponding to the resulting data OUT at when the clock pulse Cp is at a Low-to-high transition, is latched in the latching block LT1. For simplicity, the data thus correspond to the resulting data OUT (the resulting data OUT itself is in "Low") is assumed as "High".

FIG. 4 is a circuit diagram of the inverter circuit INV2 when the clock pulse Cp is in the positive edge (Low-to-high transition). As shown in FIG. 4, a voltage representing "Low" is applied to a source electrode S of the transistor NT in the inverter circuit INV2, and a voltage representing "High" is provided to a source electrode S of the transistor PT therein. A voltage representing "High" is applied to control gates of both transistors NT and PT. Threshold voltages $V_{th}$ of the transistors NT and PT are respectively set in such a manner that the transistors NT and PT are turned into "ON"-State and "OFF"-State respectively when the voltage "High" is applied to both the control gates CG. Consequently, drain electrodes D of both the transistors NT and PT are turned into a "Low" electric potential in this case.

Under the conditions, predetermined-States occur within the ferroelectric layers 32 of the transistors NT and PT as will be described subsequently. In other words, data "High" is written in the latching block LT as the predetermined polarization-States generated within the ferroelectric layers 32 of the transistors NT and PT.

Thereafter, although the transmission GT1 is turned into OFF State when the clock pulse Cp becomes "High"-State from "Low"-State, both ON State of the transistor NT and OFF State of the transistor PT are held as a result of a mechanism so called "self-latching" performed with the inverter circuits INV1 and INV2. In other words, data "High" is latched in the latching block LT.

Conditions of the transistors NT and PT starting from writing of the data "High" through the data latching will be described hereunder. Firstly, the conditions of the transistor NT will be described.

The transistor NT may be assumed as two capacitors such as a ferroelectric capacitor $C_{ferro}$ formed between the upper conductive layer 34 and the lower conductive layer 30, and a MOS capacitor $C_{MOS}$ formed between the lower conductive layer 30 and the channel region 26, both of which are connected with each other in series as shown in FIGS. 3A and 3B. The capacitor incorporates both the ferroelectric capacitor $C_{ferro}$ and the MOS capacitor $C_{MOS}$ is referred to as a capacitor $C_{GATE}$.

Figure 5:
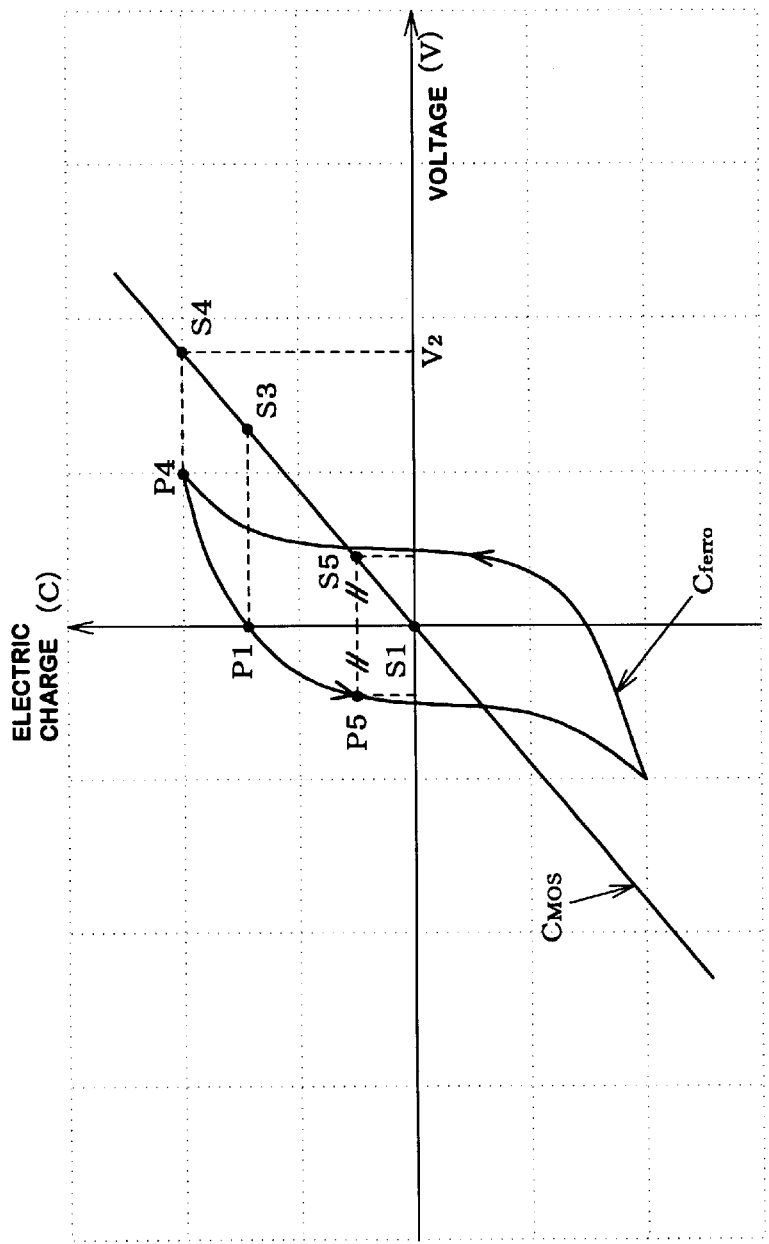
FIG. 5 is a graph showing voltage/charge characteristics of a ferroelectric capacitor $C_{ferro}$ and an MOS capacitor $C_{MOS}$ in the transistor NT when data "High" is written in the latching block LT.

FIG. 5 is a graph showing voltage/charge characteristics of a ferroelectric capacitor $C_{ferro}$ and a MOS capacitor $C_{MOS}$ in the transistor NT when data "High" is written in the latching block.

The electric potential of the channel region 26 (see FIG. 3A) is substantially equivalent to the ground voltage because the transistor NT is turned into ON State (see FIG. 4) as described above. Further, the voltage representing "High" (the power supply voltage $V_{DD}$) is applied to the control gate electrode CG of the transistor NT. In this way, the power supply voltage $V_{DD}$ having a polarity of positive which is determined based on the electric potential of the channel region 26 is applied to the capacitor $C_{GATE}$.

As a result, the condition of the voltage and the electric charges existing in the ferroelectric capacitor $C_{ferro}$ is in a point P4 as shown in FIG. 5.

Similarly, the condition of the voltage and the electric charges existing in the MOS capacitor $C_{MOS}$ is in a point S4. The value of electric charges indicated at the point S4 is equivalent to electric charges shown as the point P4. At that time, the voltage existing in the MOS capacitor $C_{MOS}$, that is a voltage generated in the lower conductive layer 30 (forming a floating gate), is in a voltage $V_2$.

Figure 6:
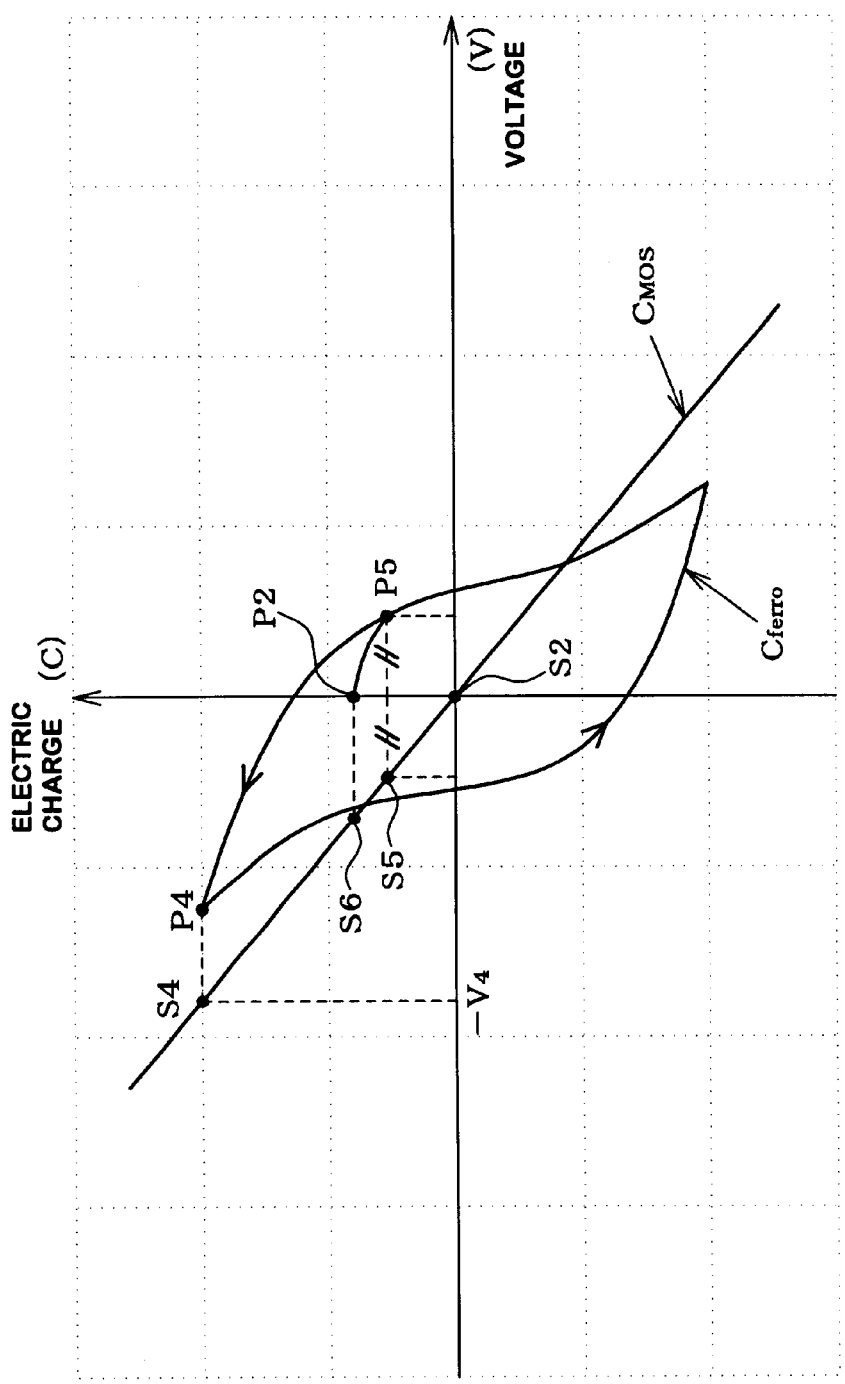
FIG. 6 is a graph showing voltage/charge characteristics of a ferroelectric capacitor $C_{ferro}$ and an MOS capacitor $C_{MOS}$ in a transistor PT when data "High" is written in the latching block LT.

Secondly, the conditions of the transistor PT will be described hereunder. FIG. 6 is a graph showing voltage/charge characteristics of a ferroelectric capacitor $C_{ferro}$ and an MOS capacitor $C_{MOS}$ in a transistor PT when data "High" is written in the latching block LT.

For easy comparison of voltage/charge characteristics of the transistor PT with that of the transistor NT, the polarity of an axis extended to the lateral direction (which represents voltage (V)) indicated in FIG. 6 is directed to the opposite to that of indicated in FIG. 5. Under the condition, the voltage—$V_4$ shown in FIG. 6 represents positive electric charges.

Electric potential of the channel region 26 is substantially equivalent to half a value of the power supply voltage $V_{DD}$ because the transistor PT shown in FIG. 4 is turned into OFF State as described above. Further, the voltage representing "High (the power supply voltage $V_{DD}$)" is applied to the control gate electrode CG of the transistor PT. In this way, a voltage equivalent to half a value of the power supply voltage $V_{DD}$ that is determined based on the electric potential of the channel region 26 is applied to the capacitor $C_{GATE}$.

As a result, the condition of the voltage and the electric charges existing in the capacitor $C_{ferro}$ is moved to a point P4, and the condition thereof in the MOS capacitor $C_{MOS}$ is also changed to the point S4 as shown in FIG. 6. At that time, the voltage existing in the MOS capacitor $C_{MOS}$, that is a voltage generated in the lower conductive layer 30 (forming a floating gate), is in a voltage—$V_4$.

Next, the operations of the latching block LT are described hereunder when the power supply of which (not shown) is shut off once and is turned on later. Firstly, the conditions of the transistor NT will be described.

The voltages and the electric charges illustrated in both the point P4 and the point S4 shown in FIG. 5 respectively existing in both the ferroelectric capacitor $C_{ferro}$ and the MOS capacitor $C_{MOS}$ in the transistor NT, are varied to the point P5 and the point S5 respectively with the time elapsed when the power supply of the latching block LT is turned off with remaining the data "High" in the latching block LT.

The electric charges illustrated in the point P5 is equivalent to that illustrated at the point S5 because the ferroelectric capacitor $C_{ferro}$ and the MOS capacitor $C_{MOS}$ are connected with each other in series. A sum total of the voltages illustrated at the point P5 and S5 are supposed to be in zero volt. Therefore, the voltage at the point P5 has the same absolute value and the opposite in the sign to the voltage at the point S5.

The voltage and electric charges existing in the MOS capacitor $C_{MOS}$ are varied rapidly to a point S4 from the point S5 soon after turning on the power supply if the power supply of the latching block LT is turned on again. The value of the electric charges illustrated in a point S4 is equivalent to that shown as the point P4. At that time, the voltage at the MOS capacitor $C_{MOS}$, that is, the voltage generated at the floating gate, is detected as the voltage $V_2$. In other words, the transistor NT is turned into ON State, just like the state at right before the shut-off of the power supply.

The condition of the voltages and the electric charges existing in the ferroelectric capacitor $C_{ferro}$ is returned to the point P4 from the point P5 as shown in FIG. 5. Similarly, the condition of the voltages and the electric charges existing in the MOS capacitor $C_{MOS}$ is returned to the point S4 from the point S5.

Subsequently, the conditions of the transistor PT will be described hereunder. The voltages and the electric charges illustrated in both the point P4 and the point S4 shown in FIG. 6 respectively existing in both the ferroelectric capacitor $C_{ferro}$ and the MOS capacitor $C_{MOS}$ in the transistor PT, are varied respectively to the point P5 and the point S5 when the power supply of the latching block LT is turned off with remaining the data "High" in the latching block LT.

The voltage and the electric charges existing in the MOS capacitor $C_{MOS}$ are varied rapidly to a point S4 from the point S5 soon after turning on the power supply if the power supply of the latching block LT is turned on again. The value of the electric charges illustrated in the point S4 is equivalent to that shown as the point P4. At that time, the voltage at the MOS capacitor $C_{MOS}$, that is the voltage at the floating gate, is detected as the voltage—$V_4$. In other words, the transistor PT is turned into OFF State, just like the state at right before the shut-off of the power supply.

The condition of the voltages and the electric charges existing in the ferroelectric capacitor $C_{ferro}$ is returned to the point P4 from the point P5 as shown in FIG. 6. Similarly, the condition of the voltages and the electric charges existing in the MOS capacitor $C_{MOS}$ is returned to the point S4 from the point S5.

It is understood that condition of the latching block LT returns to the previous state, that is a state in which the circuit holds the data "High" at right before the shut-off of the power supply, when the power supply is shut off once and is turned on later.

Although, the latching block LT that latches the data "High" therein is described in the embodiments described above, similar operations are carried out when the latching block LT latches data "Low" therein. In other words, the latching block LT is capable of reproducing data upon recovery of the power supply by storing the data during the shut-off of the power regardless of contents of the latched data.

The latching block LT comprises the inverter circuit INV2 including ferroelectric transistors. It is, therefore, the inverter circuit INV2 holds the resulting data OUT from the logic block CB in a polarization form corresponding to the resulting data OUT. In this way, the inverter circuit INV2 keeps holding the data therein even when the power supply is shut off.

As a result, the current state of the latching block LT can be made to the previous State which is right before the shut-off of the power supply quickly with certainty by using the data held therein when the power supply is in recovery. In other words, a nonvolatile type latching circuit can be realized.

Further, a time period for turning the inverter circuit INV2 into a polarization-State corresponding to the resulting data OUT is quite a short period during writing the data because a time period required for reversing polarization of ferroelectrics is quite a short period. This allows the processing circuit a high-speed operation.

Still further, lower voltages can be used for storing/erasing the data into/from the ferroelectrics. It is, therefore, not necessary to provide either of a step-up transformer on the chip or an additional power supply to heighten the voltages beside the existing power supply, so that a chip with a compact profile as well as lower manufacturing cost can be achieved.

In this embodiment, the inverter circuit INV2 including a pair of transistors both of ferroelectric transistors NT and PT, is used as a ferroelectric memorizing portion.

It is, therefore, both the transistors NT and PT hold the data in a polarization form corresponding to the resulting data OUT. As a result, the current state of the latching block LT can be made to the previous state which is right before the shut-off of the power supply quickly with certainty by using the signals held therein when the power supply is in recovery.

In that case, either one of the transistors NT or PT included in the inverter circuit INV2 can be replaced with a conventional type of transistor. Replacing one of the transistors to the conventional type accelerates the processing speed of the logic processing circuit further.

Although, ferroelectric transistors are used only for the inverter circuit INV2 provided to the feedback path out of the inverter circuits INV1 and INV2 both included in the latching block LT in the embodiments described earlier, the ferroelectic transistors can only be used for the inverter circuit INV1 provided to the main signal path instead of the inverter circuit INV2.

Figure 7:
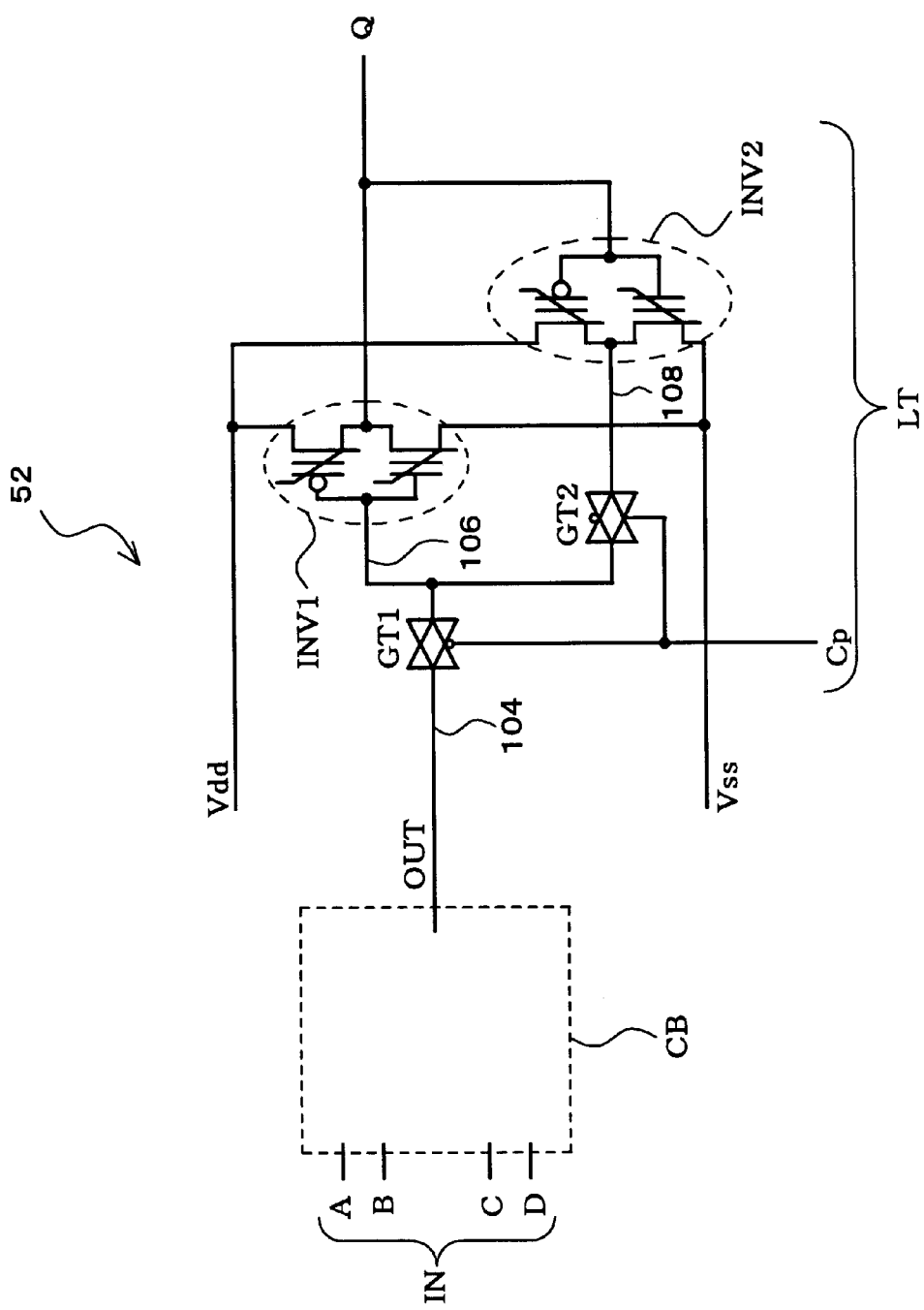
FIG. 7 is a circuit diagram illustrating a logic processing circuit 52 used in another embodiment of the semiconductor device according to the present invention.

Further, the ferroelectric transistors can be used for both the inverter circuit INV1 and the inverter circuit INV2 included in the latching block LT just like a logic processing circuit 52 used in another embodiment of the semiconductor device according to the present invention as shown in FIG. 7.

Although, ferrolectric transistors having a structure so called MFMIS structure are used as the ferroelectric transistors in the embodiments described above, other ferroelectric transistors having different structure from the MFMIS can also be used for the present invention. For example, a transistor NT shown in FIG. 13A may also be used as the ferroelectric transistor.

Figure 13A:
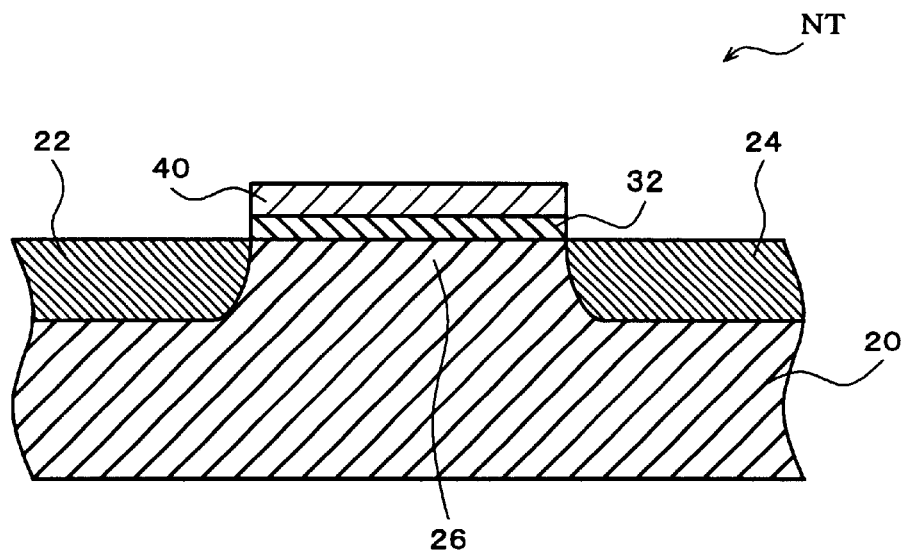
FIG. 13A is a sectional view illustrating a modified structure of the transistor NT.

The transistor NT shown in FIG. 13A is an N channel MOSFET. In the transistor NT, a source region 22 and a drain region 24 both of an n-type semiconductor are formed in a p-type semiconductor substrate 20 forming a semiconductor substrate. On a channel region 26 made of a p-type semiconductor, a ferroelectric layer 32 composed of ferroelectric materials such as PZT and the like is formed. A conductive layer 40 is located on the ferroelectric layer 32.

The transistor formed of a metal layer, a ferroelectric layer, and a silicon layer one after another from the top in that order, is referred to as an MFS-structured transistor. Beside the MFS-structured transistor, an MFIS-structured transistor interposing an insulation layer between the ferroelectric layer and the silicon layer of the MFS-structured transistor may also be used as the ferroelectric transistors.

Figure 13B:
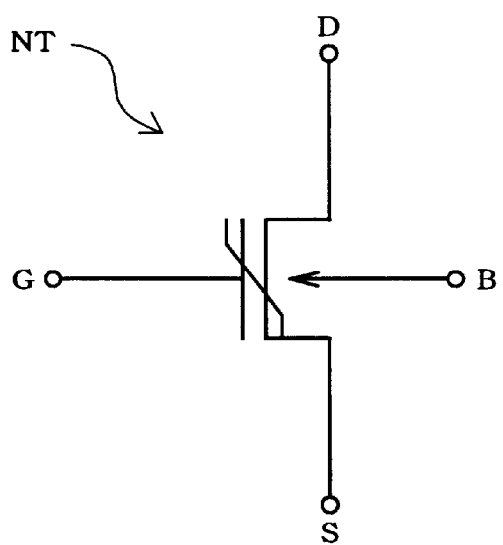
FIG. 13B is a view illustrating a schematic symbol of the modified transistor NT shown in FIG. 13A.

FIG. 13B is a view illustrating a schematic symbol of the transistor NT shown in FIG. 13A. A gate electrode G is connected to the conductive layer 40. A source electrode S and a drain electrode D are respectively connected to the source region 22 and the drain region 24.

The transistor NT is fabricated by substituting an insulation layer made of silicon oxides formed in a conventional MOSFET with a layer made of ferroelectrics such as PZT and the like. In this way, a nonvolatile type latching circuit can be produced easily by changing a part of the materials of a memory transistor used for conventional SRAMs. A transistor having similar structure with the transistor NT shown in FIG. 13A may be used as the transistor PT which is a P channel MOPSFET.

Although, ferroelectric transistors are used as the ferroelectric memorizing portion in the embodiments described above, the ferroelectric memorizing portion is not limited to the ferroelectric transistors. Ferroelectric capacitors can also be used as the ferroelectric memorizing portion. In that case, a conventional MOSFET connecting a ferroelectric capacitor to its gate electrode may be used instead of the ferroelectric transistor NT shown in FIG. 3.

In this way, a nonvolatile type latching circuit can be realized easily by just providing additional ferroelectric capacitors to the conventional MOSFET used for the prior art latching circuit without any modifications.

Further, the transmission gates are used as the gate in each of the embodiments described earlier. The gates are not limited to these. Transistors, clocked-$C_{MOS}$ inverters and some other components may be used for the gates.

Logic processing circuits using one latching block, each of which forming a signal storing circuit, are described in the above-described embodiments for simplicity. In practical use, flip-flop circuit connecting two latching blocks in series is commonly used as signal storing circuits.

Figure 23:
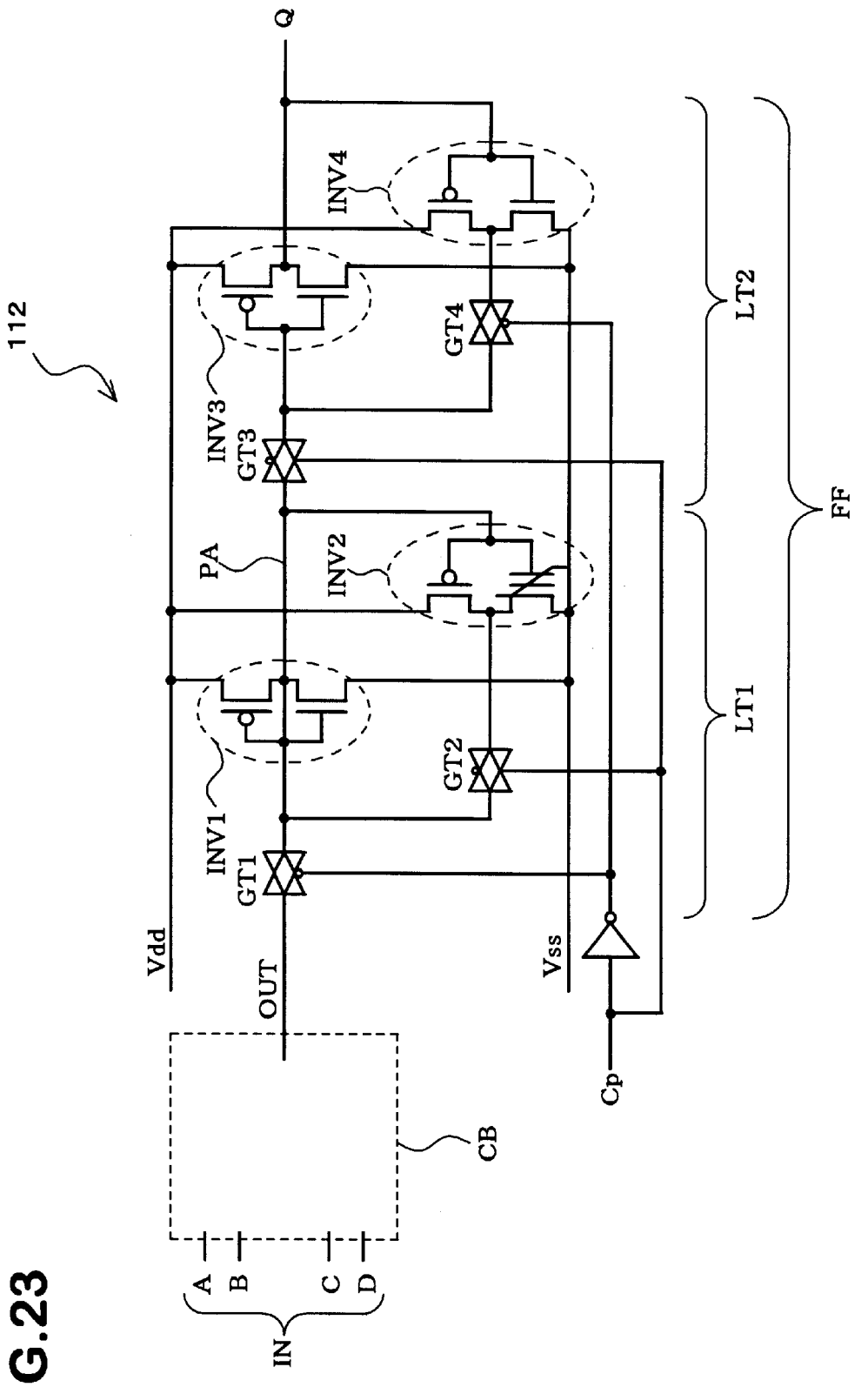
FIG. 23 is a circuit diagram illustrating a logic processing circuit 112 used in another embodiment of the semiconductor device according to the present invention.

FIG. 23 is a circuit diagram illustrating a logic processing circuit 112 used in another embodiment of the semiconductor device according to the present invention. In the logic processing circuit 112, a flip-flop circuit FF connecting two latching blocks in series is used as a signal storing circuit.

Figure 24:
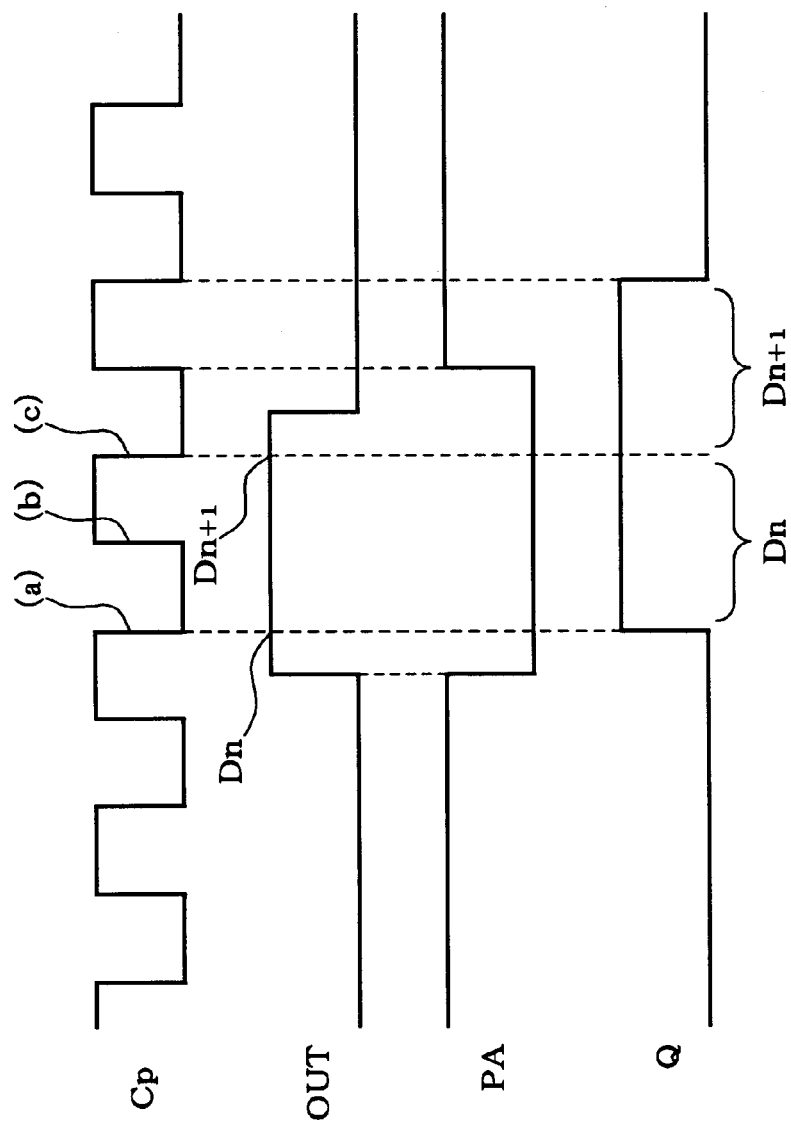
FIG. 24 is a timing chart showing the operating conditions of a flip-flop circuit FF depicted in FIG. 23.

FIG. 24 is a timing chart showing the operating conditions of a flip-flop circuit FF depicted in FIG. 23. The flip-flop circuit FF comprises a latching block LT1 (master-latching circuit) and another latching block LT2 (slave latching circuit) connected in series. The output of the latching block LT1 is labeled as a signal PA depicted in FIG. 24, that is, the signal shows signal detected at a point PA shown in FIG. 23.

The latching block LT1 is turned into the latched-State while turning the latching block LT2 into the unlatched-State when a clock pulse Cp becomes "Low"-State from "High"-State (see FIG. 24(a)). In this way, data (a resulting data OUT outputted from the logic block CB) corresponding to data Dn (the data provided currently) at the negative edge (High-to-low transition) of the clock pulse Cp (the signal detected at the point PA has a value equivalent to an inverted value of the data Dn), is latched in the latching block LT1 while outputting the data Dn as an output data Q.

Subsequently, the latching block LT1 is turned into the unlatched-State while turning the latching block LT2 into the latched-State when the clock pulse Cp becomes "High"-State from "Low"-State (see FIG. 24(b). In this way, the data Dn is latched in the latching block LT2 while outputting the data Dn again as the output data Q.

Thereafter, the latching block LT1 is turned into the latched-State again while turning the latching block LT2 into the unlatched-State when the clock-pulse Cp becomes "Low"-State from "High"-State (see FIG. 24(c)). In this way, data corresponding to the dada Dn+1 (the data will be provided subsequently) at the negative edge (High-to-low transition) of the clock pulse Cp (the signal detected at the point PA has a value equivalent to an inverted value of the data Dn), is latched in the latching block LT1 while outputting the data Dn+1 as the output data Q.

With the flip-flop circuit FF, the data thus latched can be outputted within a duration equivalent to one complete cycle of the clock pulse Cp by latching data at the negative edge of the clock pulse Cp. Consequently, further stable outputs without noises can be obtained by eliminating them even when data (the resulting data from the logic block CB) contain noises.

Sequential processing having much higher reliability and other related processing can be performed by using a combination of a plurality of the logic blocks CB and the flip-flops FF described above, each of the logic blocks CB including logic gates and other components.

Although, a ferroelectric transistor is used for one of the transistor (an N channel MOSFET) in the inverter circuit INV2 included in the latching block LT1 in the flip-flop circuit FF shown in FIG. 23, the ferroelectric transistor can be used for any other transistors in the inverter circuits included in the latching blocks in the flip-flop circuit FF. Further, more than two transistors in these transistors may also be replaced with ferroelectric transistors.

Each of the variations described above can also be applied to the embodiments described hereunder.

Figure 8:
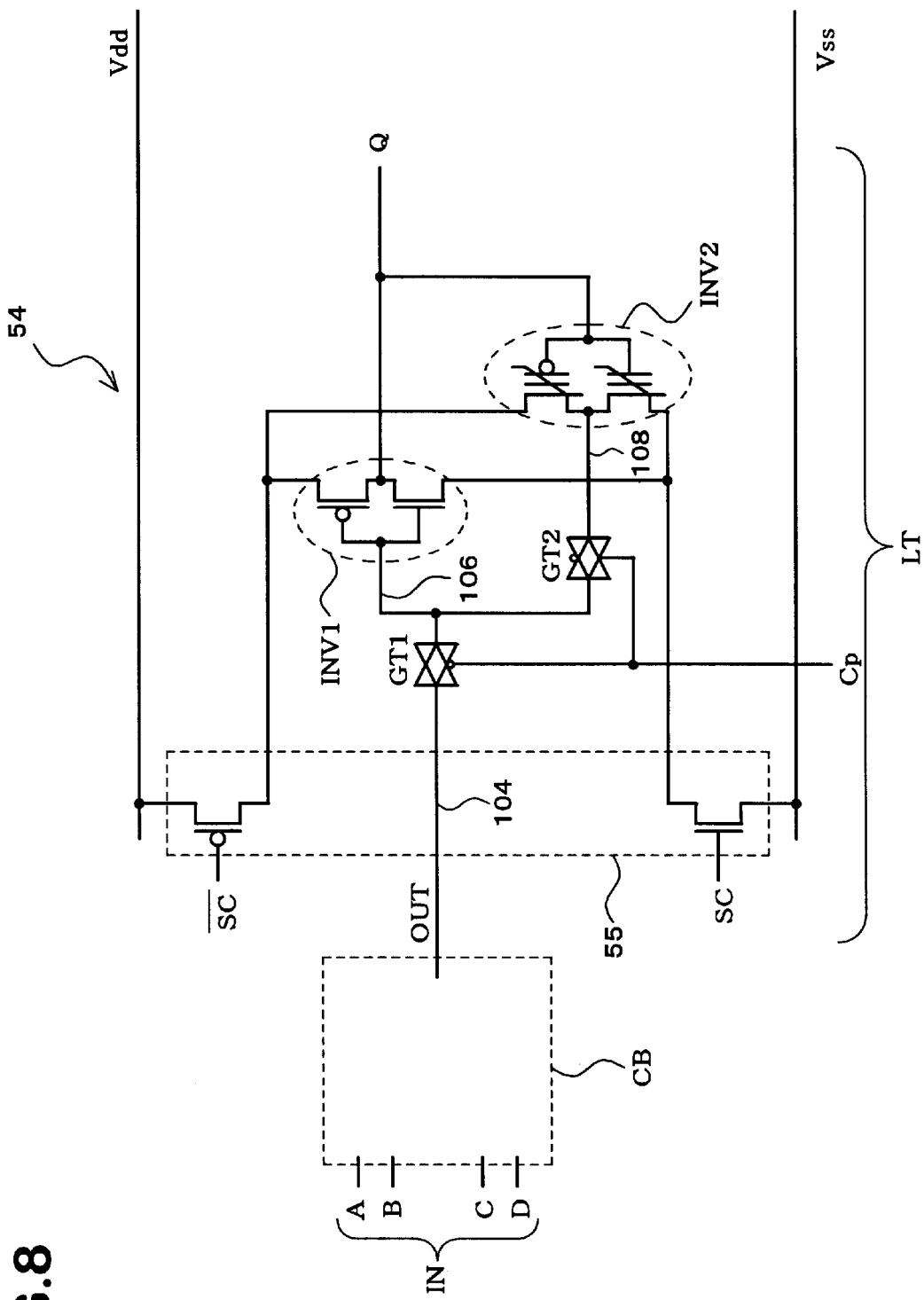
FIG. 8 is a circuit diagram illustrating a logic processing circuit 54 used in far another embodiment of the semiconductor device according to the present invention.

FIG. 8 is a circuit diagram illustrating a logic processing circuit 54 used in far another embodiment of the semiconductor device according to the present invention. Both the processing circuit 54 shown in FIG. 8 and the processing circuit 50 shown in FIG. 1 have the same structures except that a power control portion 55 switching or controlling the power supplied to the latching block LT is provided to the processing circuit 54.

The control portion 55 comprises a P channel MOSFET and an N channel MOSFET, and the control portion 55 controls the power supply to the latching block in accordance with a power control signal SC provided thereto.

Power consumption of the processing circuit 54 can be suppressed as a result of shut-off the power supplied to the latching bock LT not under operation by the control portion 55 provided therein. In that case, the ferroelectric transistor included in the inverter INV2 keep holding its polarization-State even when the power supplied to the latching bock LT is shut off. As a result, a signal corresponding to the Polarization-State can be provided to the line 104 when the power supply is turned ON again.

Figure 9:
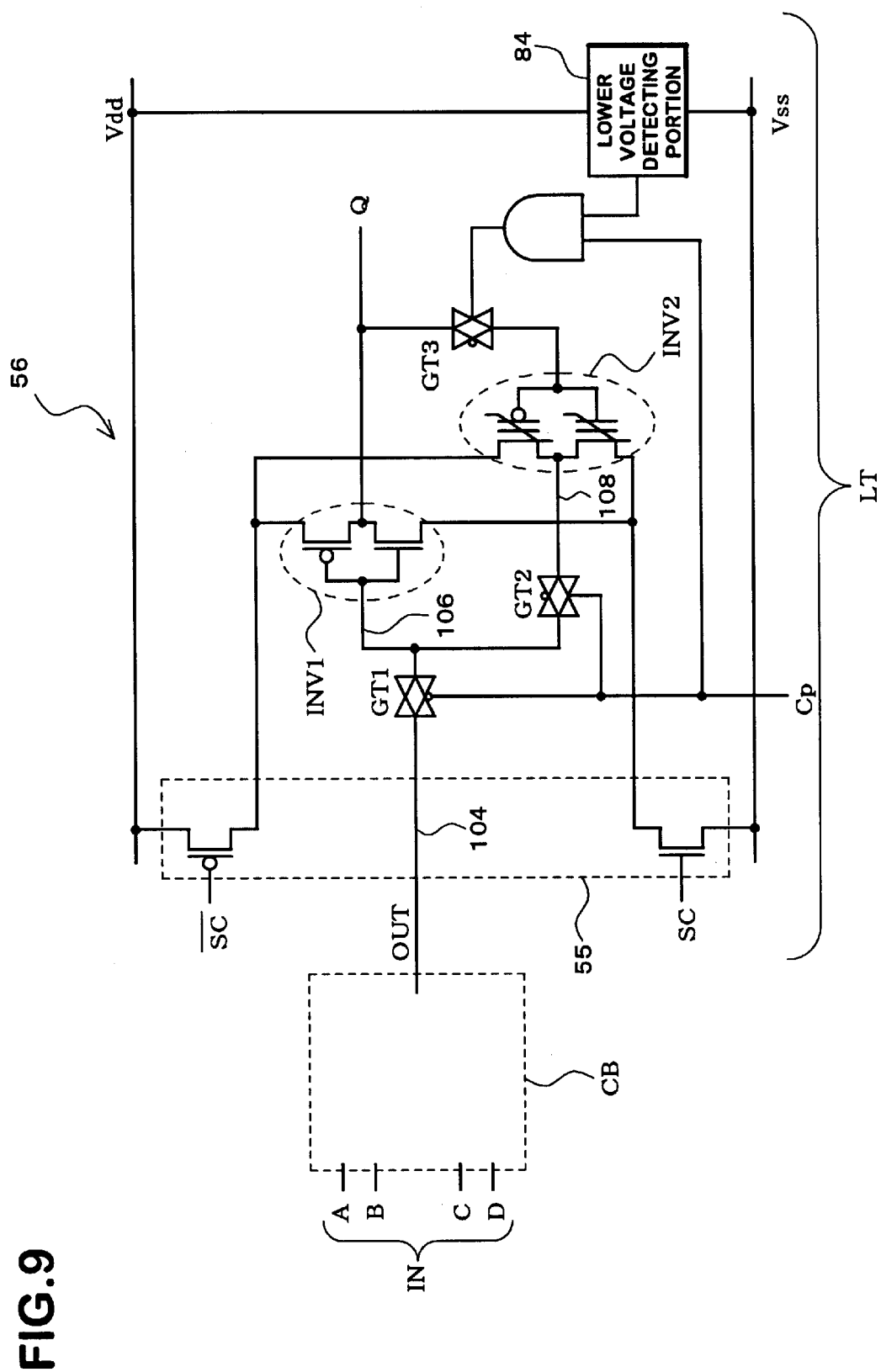
FIG. 9 is a circuit diagram illustrating a logic processing circuit 56 used in still another embodiment of the semiconductor device according to the present invention.

FIG. 9 is a circuit diagram illustrating a logic processing circuit 56 used in still another embodiment of the semiconductor device according to the present invention. Both the processing circuit 56 shown in FIG. 9 and the processing circuit 54 shown in FIG. 8 have the same structures except that another gate transmission gate GT3 forming a memorizing gate for switching the connection between the line 108 and the inverter circuit INV2 provided thereto, is provided to the processing circuit 56 as well as carrying out corresponding operation of the transmission gate GT3 with the variation of the power supply voltage.

The transmission gate GT3 is designed so as to turn into OFF State when a lower voltage-detecting portion 84 detects degradation of the power supply voltage. In this way, unexpected variation of the Polarization-State in the ferroelectric transistor of the inverter circuit INV2 caused by the degradation of the power supply voltage can be avoided.

Although, only the transmission gate GT3 is turned into OFF when degradation of the power supply voltage is detected in this embodiment, other transmission gates such as the transmission gate GT2 may also be turned into OFF State simultaneously.

In this embodiment, the transmission gate GT3 is designed so as to operate under an ordinary clock pulse Cp as well and is turned ON/OFF simultaneously with that of the transmission GT2. From a point of view, the transmission gate GT3 may be considered as a memorizing gate as well as serving as a feedback gate.

Figure 10:
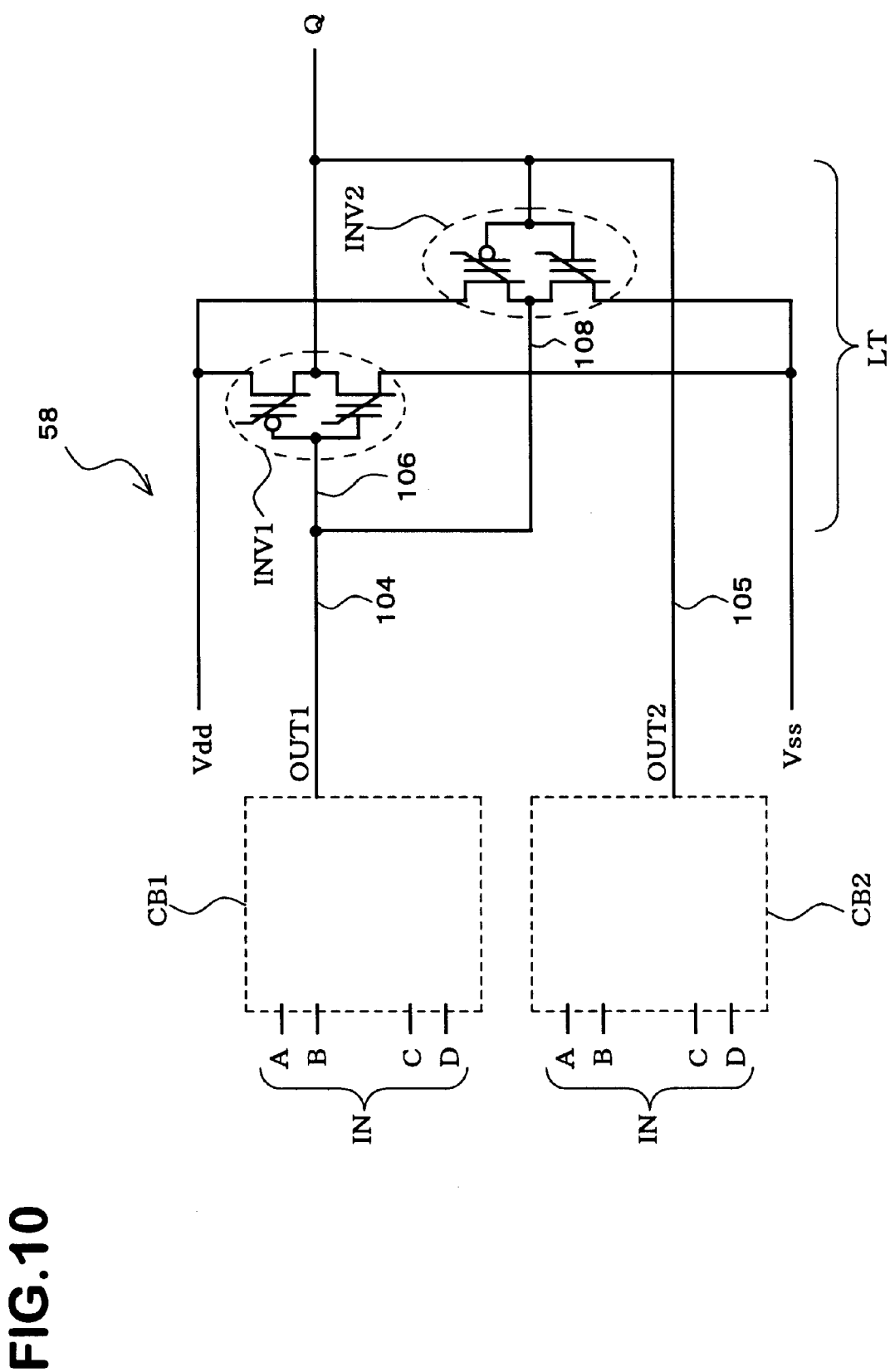
FIG. 10 is a circuit diagram illustrating a logic processing circuit 58 used in yet another embodiment of the semiconductor device according to the present invention.

FIG. 10 is a circuit diagram illustrating a logic processing circuit 58 used in yet another embodiment of the semiconductor device according to the present. Unlike to the processing circuit 52 shown in FIG. 7, the processing circuit 58 shown in FIG. 10 has none of the transmission gates GT1 and GT2, but the two logic blocks are provided thereto.

Logic blocks CB1 and CB2 respectively output resulting data OUT1 and OUT2 after performing predetermined logic operations to inputted data IN (for example, a total of four inputs such as inputs "A", "B", "C" and "D" through input terminals) of each block.

The resulting data OUT1 outputted from the logic block CB1 is provided to the input terminal of the inverter circuit INV1 via the line 104, and an output of the inverter circuit INV1 is provided as the output data Q. The resulting data OUT2 outputted from the logic block CB2, on the other hand, is provided to the input terminal of the inverter circuit INV2 via the line 105.

Although, no specific relationship is defined between the resulting data OUT1 and resulting data OUT2, both the logic blocks CB1 and CB2 can be designed so that the relationship of the resulting data OUT1 and resulting data OUT2 outputted therefrom becomes a complementary relationship.

As described above, the processing circuit 58 has none of the transmission gates GT1 nor GT2 therein unlike to the processing circuit 52 shown in FIG. 7, instead, the logic blocks CB1 and CB2 both also serving as these transmission gates are provided thereto. The remaining structure of the circuit 58 is the same as the processing circuit 52 shown in FIG. 7.

At least one transistor out of four transistors included in the inverter circuits INV1 and INV2 may be a ferroelectric transistor in the circuit 58 similar to the embodiments described earlier. Less ferreoelctric transistors in number used for the inverter circuits INV1 and INV2 accelerates the operating speed of the circuit 58.

Figure 11:
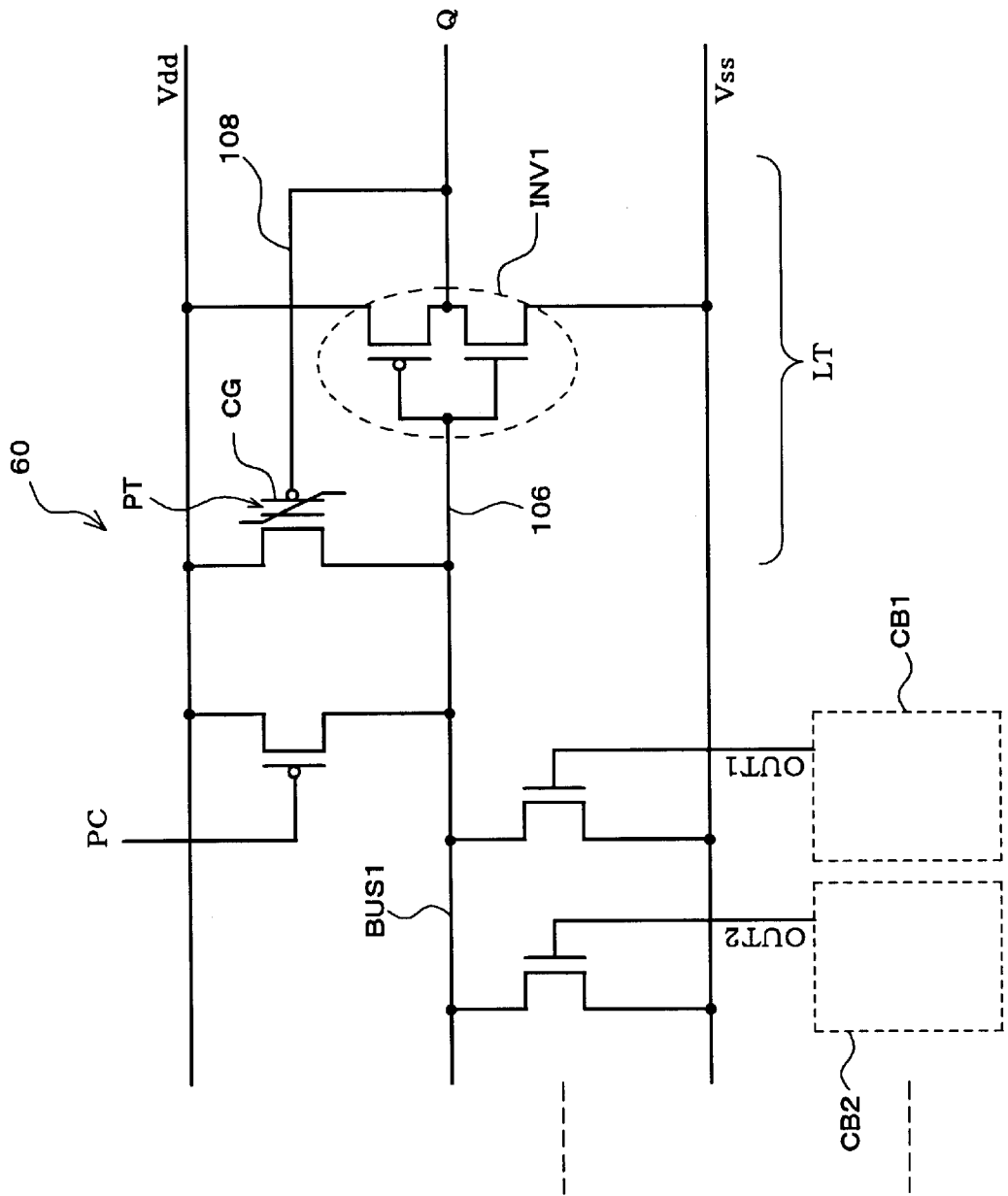
FIG. 11 is a circuit diagram illustrating a logic processing circuit 60 used in further embodiment of the semiconductor device according to the present invention.

FIG. 11 is a circuit diagram illustrating a logic processing circuit 60 used in further embodiment of the semiconductor device according to the present invention. A latching block LT is used for latching data on a bus line BUS1.

The circular signal path including both a line 106 forming a main signal path and a line 108 serving as a feedback path, is formed on a part of the bus line BUS1. The inverter INV1 is provided to the line 106. The input terminal of the inverter circuit INV1 and a line through which the power supply voltage Vdd serving as a predetermined reference voltage, are connected with each other via the transistor PT. The transistor PT forms a switching circuit including a control gate electrode CG which acts as a control input terminal.

Further, the output terminal of the inverter circuit INV1 and the control gate CG are connected with the line 108 which forms a part of the feedback signal path. In this embodiment, the inverter circuit INV1 is made of a CMOS inverter circuit using a conventional MOSFET while employing a ferroelectric transistor for the transistor PT. As a consequence, the transistor PT forms a ferroelectrics portion in this embodiment.

The bus line BUS1 is charged to "High"-State (equal to the power supply voltage Vdd) by pre-charging signals PC generated at a predetermined period, and the transistor PT maintains the State "High" on the bus line BUS1.

The processing circuit 60 comprises a plurality of logic blocks CB1, CB2 and so on and is designed so that the bus line BUS1 is turned into "Low"-State (equal to the ground voltage $V_{ss}$) in accordance with resulting data OUT1 and OUT2 and so on outputted by the logic blocks CB1, CB2 and so on. In this way, the resulting data OUT1 and OUT2 and so on from the logic blocks CB1, CB2 and so on can be outputted on the bus line BUS1 at an appropriate timing.

As described above, the transistor PT is formed of a ferroelectric transistor in the circuit 60. The condition of the bus line BUS1, that is, a signal on the bus line BUS1 is stored in the transistor PT in polarization form corresponding to the signal. In this way, the transistor PT maintains the state on the bus line BUS1 even when the power supply is shut off, and the signal thus maintained is reproduced on the bus line BUS1 upon recovery of the power supply.

Figure 12:
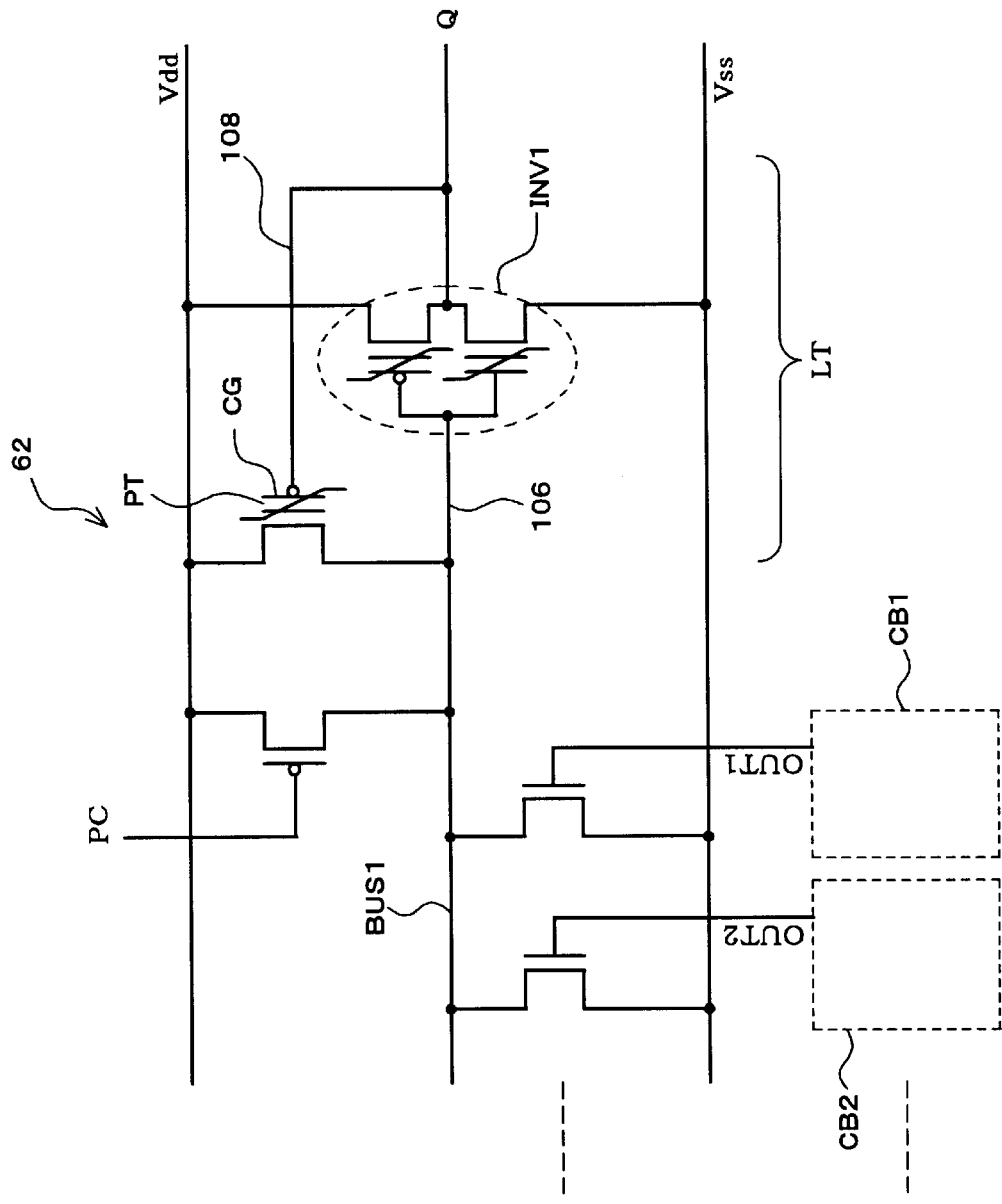
FIG. 12 is a circuit diagram illustrating a logic processing circuit 62 used in still further embodiment of the semiconductor device according to the present invention.

Although, transmission speed of the signal in the circuit 60 is accelerated by using conventional MOSFETs for the inverter circuit INV1 in the embodiment described above, the inverter circuit INV1 may also be made by using ferroelectric transistors just like a logic processing circuit 62 used in still further embodiment of the semiconductor device according to the present invention shown in FIG. 12.

The remaining structure of the logic circuit 62 shown in FIG. 12 is the same as that of the circuit 60 shown in FIG. 11. A conventional P channel MOSFET can be used for the transistor PT instead of a feroelectric transistor in the circuit 62 shown in FIG. 12.

Figure 14:
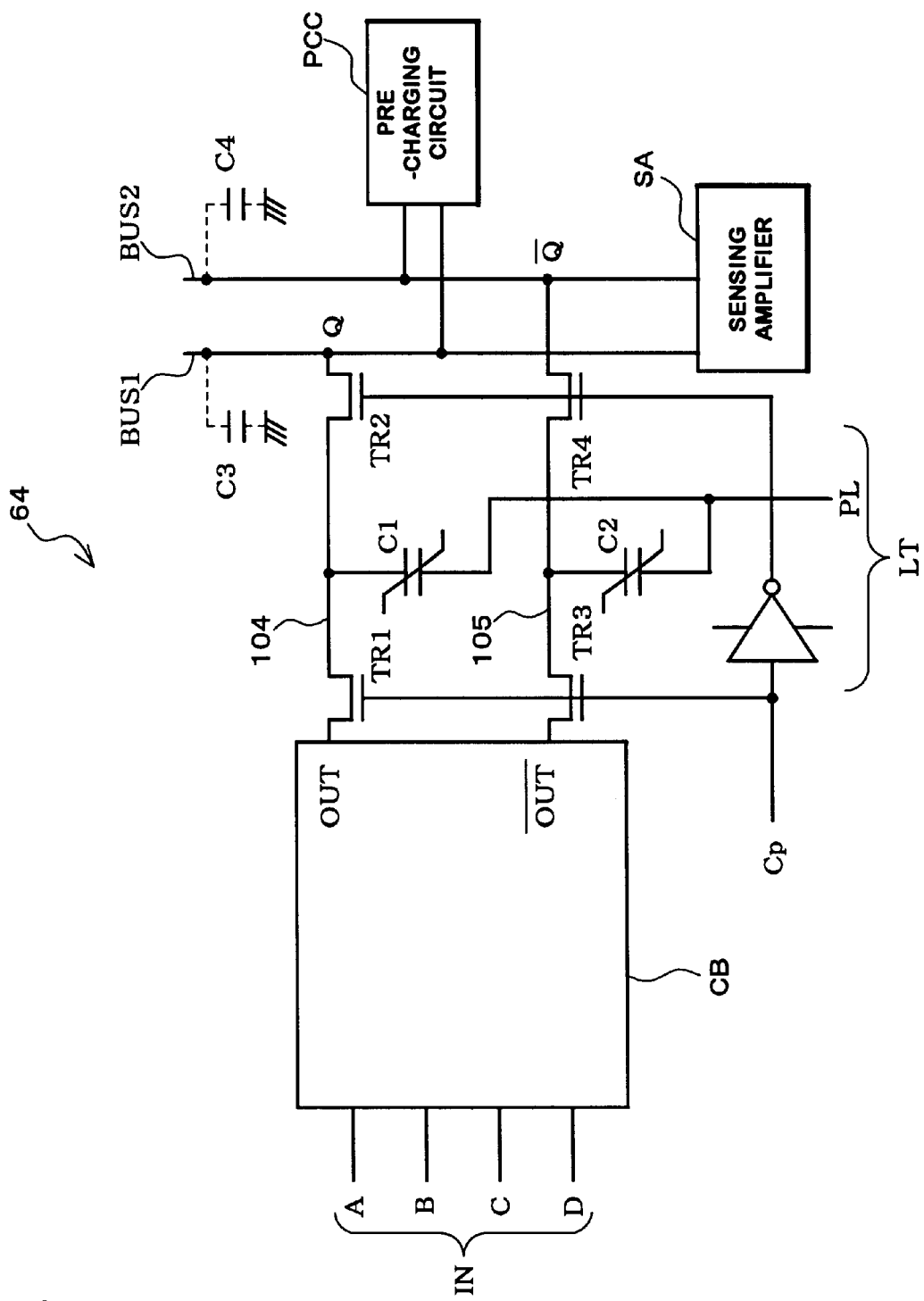
FIG. 14 is a circuit diagram illustrating a logic processing circuit 64 used in yet further embodiment of the semiconductor device according to the present invention.

FIG. 14 is a circuit diagram illustrating a logic processing circuit 64 used in yet further embodiment of the semiconductor device according to the present invention. The logic processing circuit 64 comprises a combined logic block CB forming a combined circuit and a latching block LT serving as a signal storing circuit similar to the embodiments described earlier.

The logic block CB includes the NAND gates, the OR gates, other kinds of gates, or equivalents thereof and outputs a resulting data OUT (and inverted resulting data) after performing a predetermined logic operation and other operation(s) to an inputted data IN (for example, a total of four inputs such as inputs "A", "B", "C" and "D" through input terminals) of each block.

The latching block LT includes a line 104 forming a signal path for passing the resulting data OUT. In the latching block LT, a transistor TR1 forming an input gate and another transistor TR2 serving as an output gate are provided to the line 104 in series, the transistor TR1 carrying out switching operation for passing the resulting data OUT in accordance with a clock pulse Cp and the transistor TR2 performing switching operation opposite to the transistor TR1.

One end of a ferroelectric capacitor C1 is connected to the line 104 at a position between the transistor TR1 and the transistor TR2, and voltages synchronized with the clock pulse Cp are applied to the other end of the capacitor C1 through a plate line PL.

Also, the line 104 and the bus line BUS1 are connected with each other through the transistor TR2. In this way, the resulting data OUT outputted from the logic block CB is transmitted to the bus line BUS1 through both the transistors TR1 and TR2.

The ferroelectric capacitor C1 is formed by interposing a ferroelectric layer made of PZT and the like between two electrodes. The capacitor C1 holds polarization-States corresponding to the resulting data OUT as will de described subsequently.

A signal path for passing the inverted resulting data has the same structure as the signal path passing the resulting data OUT. In this way, the line 105 part of which forms the signal path for passing the inverted resulting data is connected to the bus line BUS2 via the transistor TR4.

A pre-charging circuit PCC and a sensing amplifier SA are connected to a pair of the bus lines BUS1 and BUS2. It is assumed that load capacitors C3 and C4 are respectively formed between the pair of bus lines BUS1 and BUS2 and the ground voltage.

With the design described above, the latching block LT capable of connecting the pair of bus line BUS1 and BUS2 can be realized easily. Both the resulting data OUT and inverted resulting data can be held in the circuit 64 even when the power supply is shut off.

The operation of the latching block LT included in the circuit 64 will be described with reference to a timing chart shown in FIG. 15. The description will be made by focusing on the signal path for passing the resulting data OUT provided in the latching block LT for simplicity.

The transistors TR1 and TR2 are respectively in ON-State and OFF-State when the clock pulse Cp is in "High"-State (see FIG. 15(a)).

Figure 15:
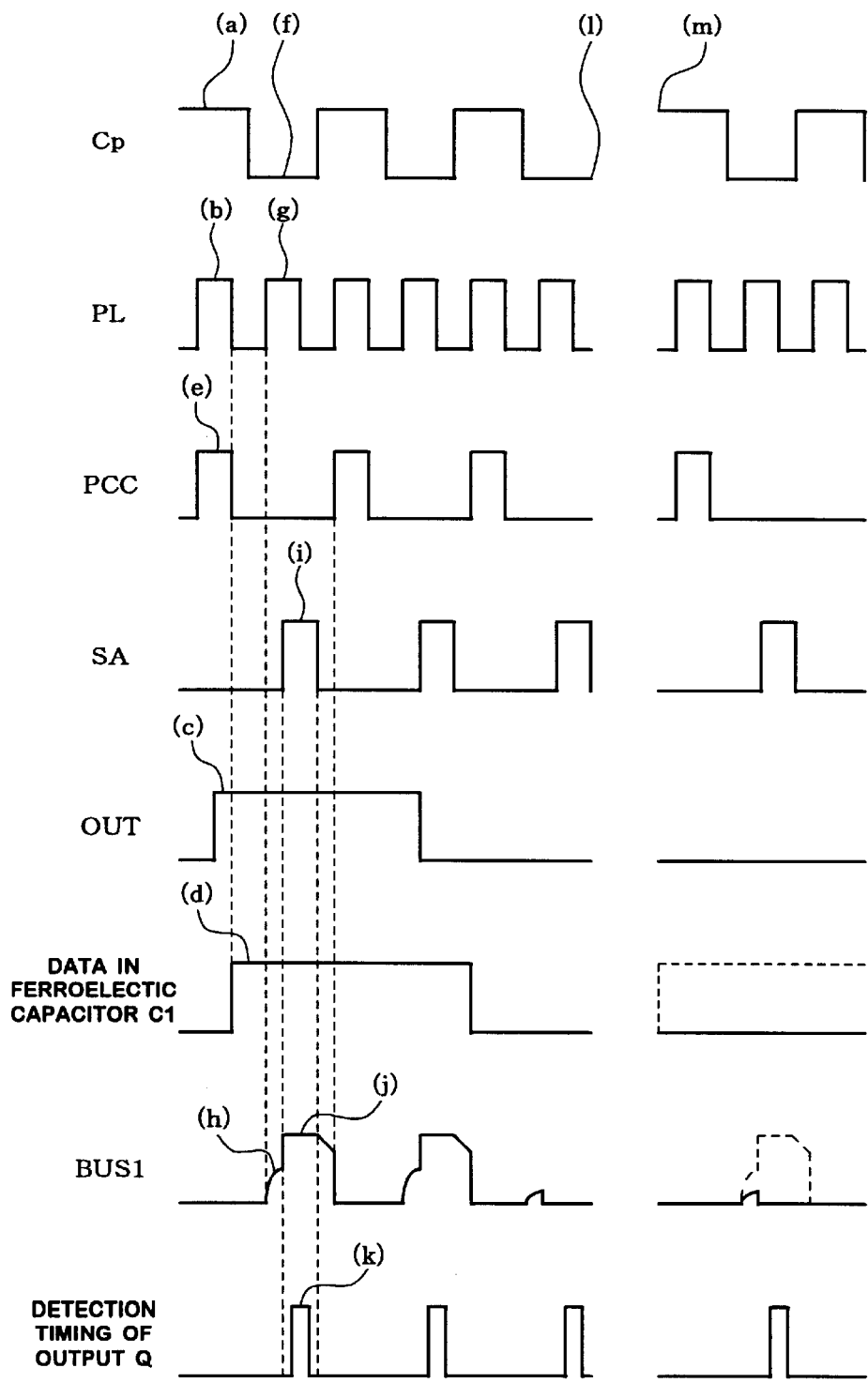
FIG. 15 is a timing chart showing the operating conditions of the latching block LT forming the logic processing circuit 64.

At that time, a predetermined voltage synchronized with the clock pulse Cp is applied to the plate line PL (see FIG. 15(b)). The polarization-State of the ferroelectric capacitor C1 is turned into a state corresponding to the resulting data OUT ("High"-State in FIG. 15, see FIG. 15(c)), as a consequence (see FIG. 15(d)). The pre-charging circuit PCC, on the other hand, is turned into ON State, as a result of synchronized with the clock pulse Cp (see FIG. 15(e)). In this way, the load capacitor C3 is pre-charged to the ground voltage.

Thereafter, transistors TR1 and TR2 are respectively turned into OFF State and ON State when the clock pulse Cp becomes "Low"-State (see FIG. 15(f)).

At that time, a predetermined voltage synchronized with the clock pulse Cp is applied again to the plate line PL (see FIG. 15(g)). In this way, a voltage corresponding to the polarization-State held in the ferroelectric capacitor C1 is on the bus line BUS1 (see FIG. 15(h)).

Thereafter, the sensing amplifier SA is turned into ON State as a result of synchronized with the clock pulse Cp (see FIG. 15(i)). The sensing amplifier SA increases the electric potential of the bus line BUS1 to a predetermined logic level (to the "High"-State in this case, see FIG. 15(j)) as a result of comparison between a voltage corresponding to the polarization-State in the ferroelectric capacitor C1 (see FIG. 15(h)) and a voltage corresponding to the polarization-State in the ferroelectric capacitor C2 (not shown). The predetermined logic level may also be in "Low"-State. The output Q is detected within a time period in which the electric potential on the bus line BUS1 is in the predetermined logic level (see FIG. 15(k)). At that time, detection of the output Q is carried out by synchronizing to the clock pulse Cp.

In this way, the resulting data is latched in the latching block LT, and the resulting data thus latched is outputted at a predetermined timing. The inverted resulting data is treated in the similar way.

As described earlier, the latching block LT holds data even when the power supply is shut off. In this way, the data thus held can be read out to the latching block LT by carrying out similar procedure to that carried out for reading out data as described above when the power supply is in recovery.

Description of the data storing/read out operations will be made in detail focused on the Polarization-State held in the ferroelectric capacitor C1. The signal path for passing the resulting data OUT in the latching block LT will be described for simplicity.

Figure 16:
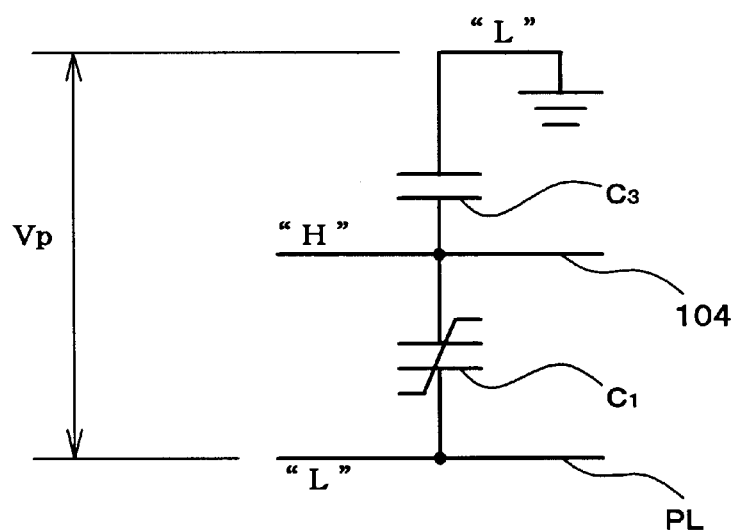
FIG. 16 is circuit diagram of both a ferroelectric capacitor C1 and a load capacitor C3, and vicinity thereof
Figure 17:
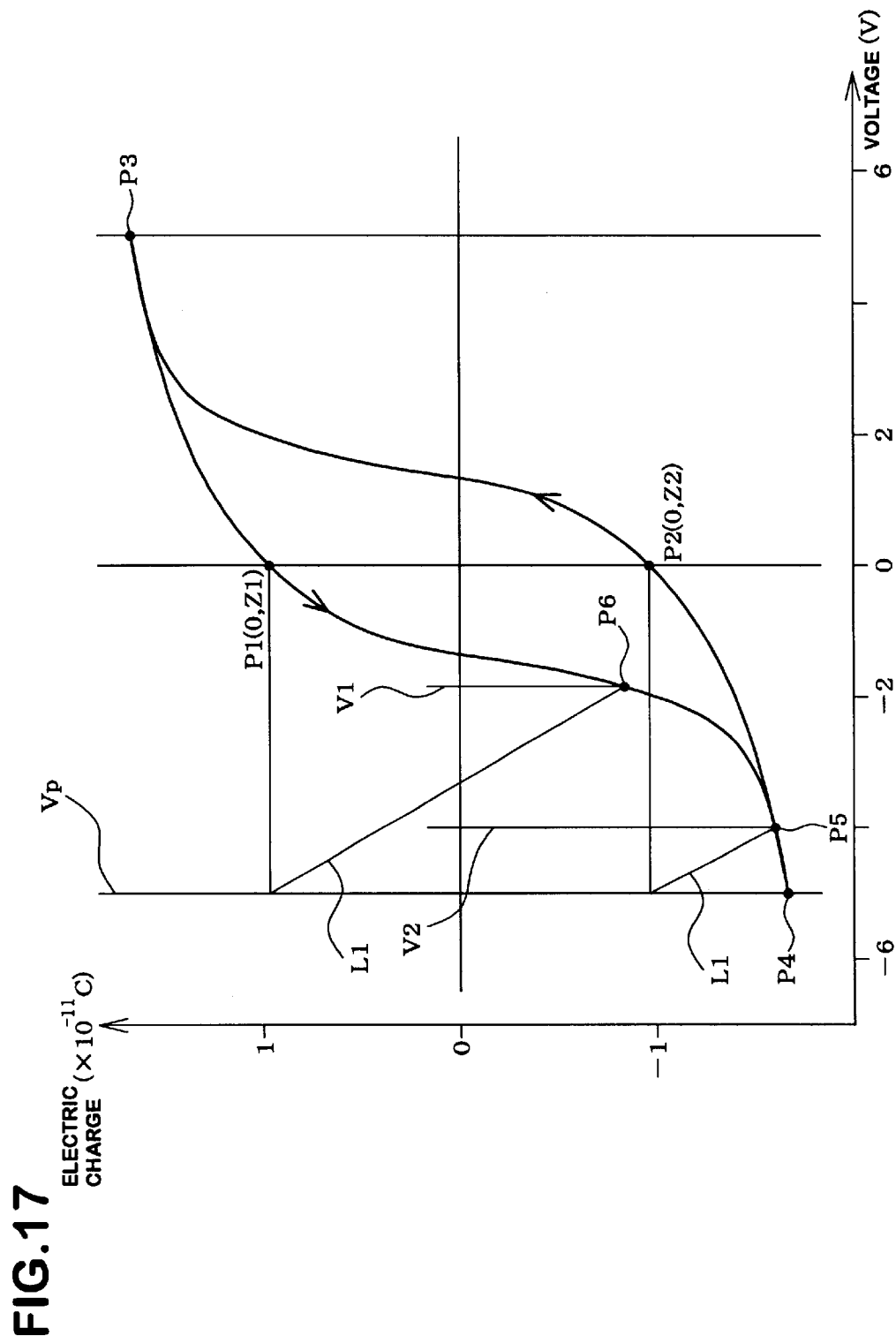
FIG. 17 is a graph showing a hysteresis loop representing a relationship between voltages applied to the capacitor C1 and polarization-States occurred therein.

FIG. 16 is a circuit diagram of both a ferroelectric capacitor C1, a load capacitor C3, and vicinity thereof, the circuit corresponding to the signal path for passing the resulting data OUT in the latching clock LT. FIG. 17 is a graph showing a hysteresis loop (voltage/charge characteristics) representing a relationship between voltages applied to the capacitor C1 (electric potentials on the line 104 when the electric potential on the plate line PL shown in FIG. 16 is defined as a reference value) and Polarization-States (indicating as "electric charges" equivalent to "Polarization-State" in the drawing) occurred therein.

A state under remanent polarization Z1 and another state under remanent polarization Z2 are respectively defined as a Polarization-State P1 and a Polarization-State P2 in FIG. 17.

The transistors TR1 and TR2 are respectively in ON State and in OFF State at when data writing into the circuit 64 is initiated (when clock pulse Cp is "High"-State, see FIG. 15(a)). Although, a predetermined voltage corresponding to the clock pulse Cp is applied to the plate line PL at the data writing (see FIG. 15(b)), the data is written in the ferroelectric capacitor C1 when the voltage applied to the plate line PL is in negative edge (high-to-low transition) in the case shown in FIG. 15. FIG. 16 shows the state of signals applied to both the ferroelectric capacitor C1 and the load capacitor C3 and vicinity thereof at the negative edge.

At that time, an electric potential representing "High"-State generated by the resulting data OUT outputted from the logic block CB is supplied to one end of the ferroelectric capacitor C1 and another electric potential representing "Low"-State is applied to the other end of the ferroelectric capacitor C1 (to the plate line PL).

In this way, both the load capacitor C3 and the ferroelectric capacitor C1 are electrically charged. At that time, the ferroelectric capacitor C1 is in the Polarization-State P3 shown in FIG. 17.

The transistors TR1 and TR2 are respectively turned into OFF State and ON State when data is read out from the circuit 64 (when clock pulse Cp is in "Low"-State, see FIG. 15(f). As a consequence, the Polarization-State of the ferroelectric capacitor C1 starts moving to the state P1 from the state P3.

During the read out data, a voltage V1 corresponding to the polarization-State of the ferroelectric capacitor C1 is generated on the line 104 and the bus line BUS1 connected thereto (see FIG. 15(h)) when the predetermined voltage synchronized with the clock pulse Cp is applied to the plate line PL (see FIG. 15(g)).

At that time, the Polarization-State of the ferroelectric capacitor C1 in which the voltage V1 being generated, is illustrated in the point P6 in FIG. 17. The electric potential of the bus line BUS1 is increased to the predetermined logic level (to the "High"-State in this case, see FIG. 15(j)) as described earlier) in accordance with the difference between the voltage V1 and the voltage on the line 105 connected to one end of the other ferroeledctric capacitor C2 and the bus line BUS2 connected to the line 105. The output Q is detected when the electric potential of the bus line BUS1 is in the predetermined logic level as described earlier.

Figure 18:
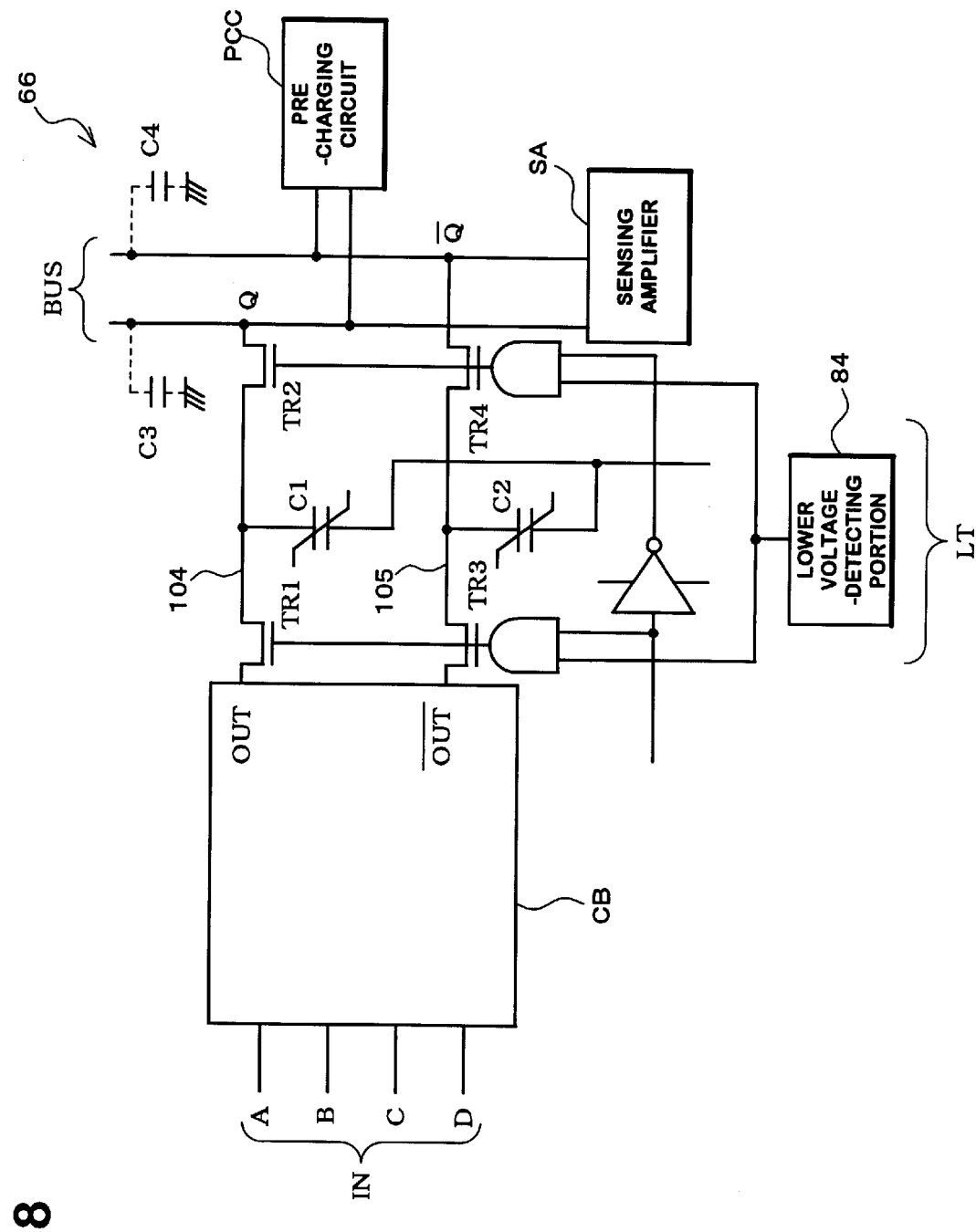
FIG. 18 is a circuit diagram illustrating a logic processing circuit 66 used in further embodiment of the semiconductor device according to the present invention.

FIG. 18 is a circuit diagram illustrating a logic processing circuit 66 used in further embodiment of the semiconductor device according to the present invention. Both the processing circuit 66 in FIG. 18 and the processing circuit 54 shown in FIG. 14 have the same structures except that the transistors TR1, TR2, TR3 and TR4 are operated correspondingly with the variation of the power supply voltage in the circuit 66.

The circuit 66 is designed so that all the transistors TR1, TR2, TR3 and TR4 are turned into OFF State when degradation of the power supply voltage is detected with the lower voltage-detecting portion 84. Under the design, it is possible to prevent undesirable variation of the Polarization-State in the ferroelectric capacitors C1 and C2, the undesirable variation being caused by voltage drop of the power supply voltage. In other words, the transistors TR1, TR2, TR3, and TR4 also serve as the memorizing gate in this embodiment.

Figure 19B:
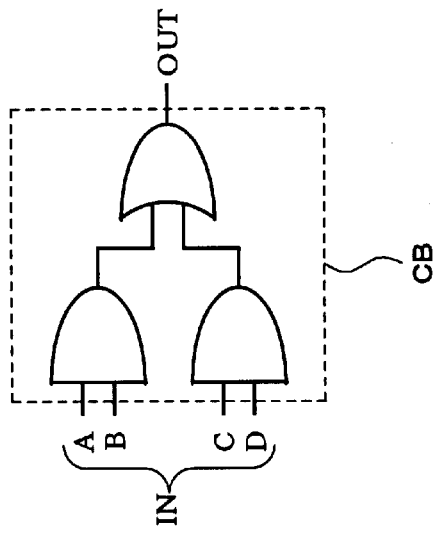
FIG. 19B is a view illustrating the combined logic block CB with logic gates.
Figure 19A:
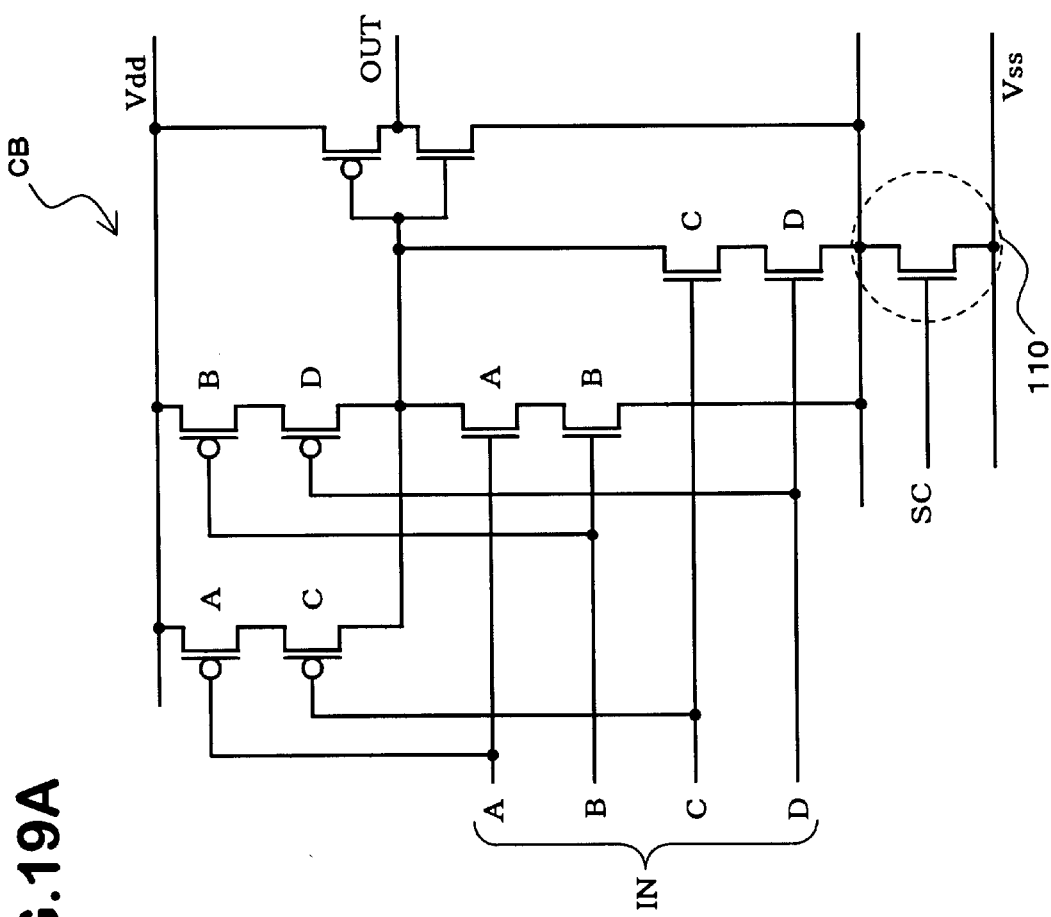
FIG. 19A is a circuit diagram illustrating one example of a combined logic block CB forming logic processing circuits used in the semiconductor device described in embodiments according to the present invention.

FIG. 19A is a circuit diagram illustrating one example of a combined logic block CB forming logic processing circuits used in the semiconductor device described in embodiments according to the present invention. FIG. 19B is a view illustrating the combined logic block CB with logic gates. The circuit shown in FIG. 19A is a low-power consumption type logic circuit comprising a power control portion 110. The control portion 110 includes an N channel MOSFET and controls the power supply provided to the logic block CB in accordance with the power control signal SC.

Power consumption of the logic processing circuits can be suppressed as a result of shut-off the power supplied to the logic bock CB not under operation by the control portion 110 provided to logic processing circuit.

Figure 20:
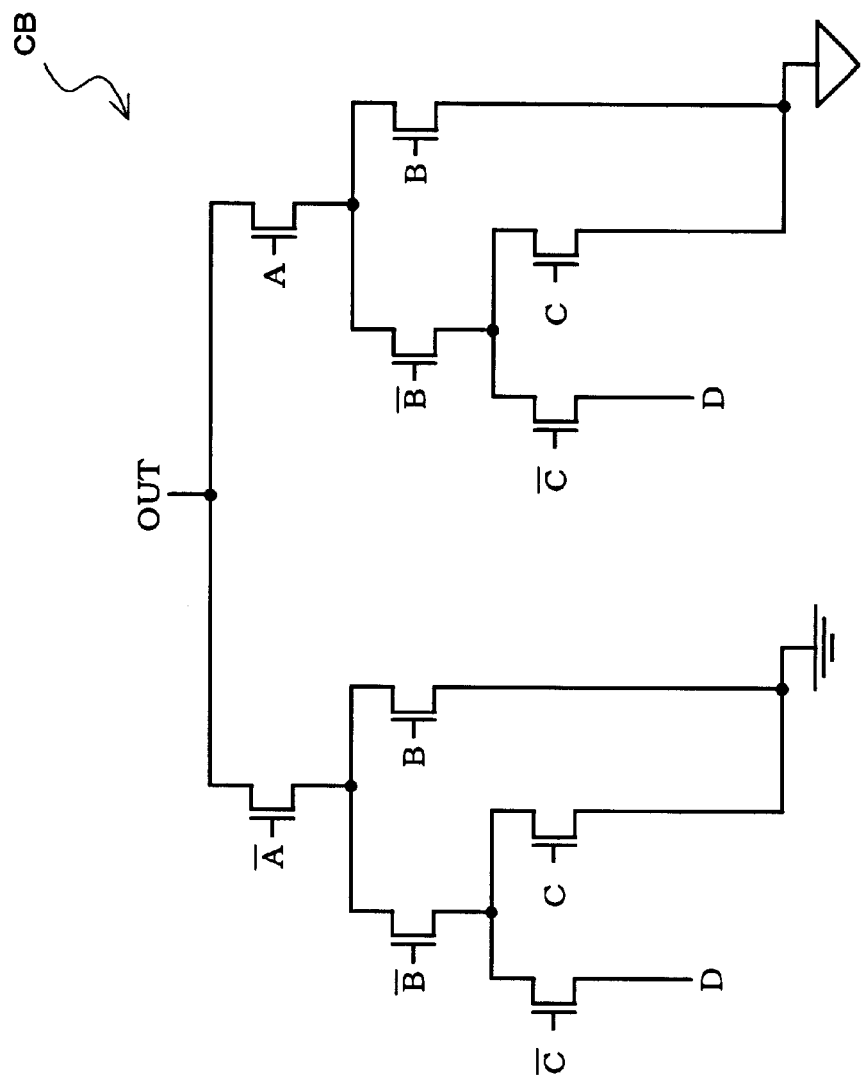
FIG. 20 is a circuit diagram illustrating another example of the combined logic block CB forming logic processing circuits used in the semiconductor device described in embodiments according to the present invention.

FIG. 20 is a circuit diagram illustrating another example of the combined logic block CB forming logic processing circuits used in the semiconductor device described in embodiments according to the present invention. The circuit shown in FIG. 20 is a low-power consumption type logic block CB, and uses a new design concept so called "path-logic". The use of such design criteria allows the number of the elements used therein in much smaller number.

Figures 21A, 21B:
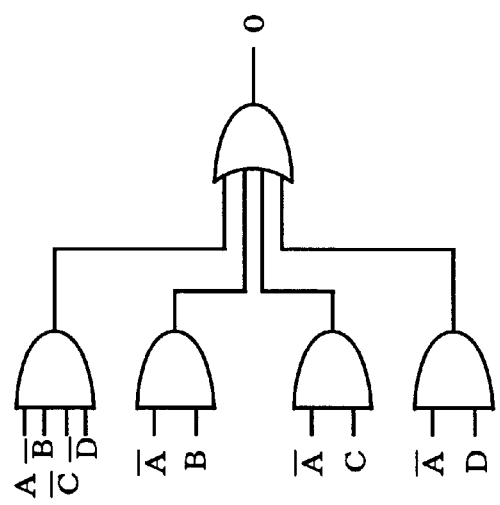
FIG. 21A is a truth table showing the operating conditions of a path-logic circuit shown in FIG. 20.
FIG. 21B is a view illustrating CMOS logic gates operated under the truth table shown in FIG. 21A.
Figure 22:
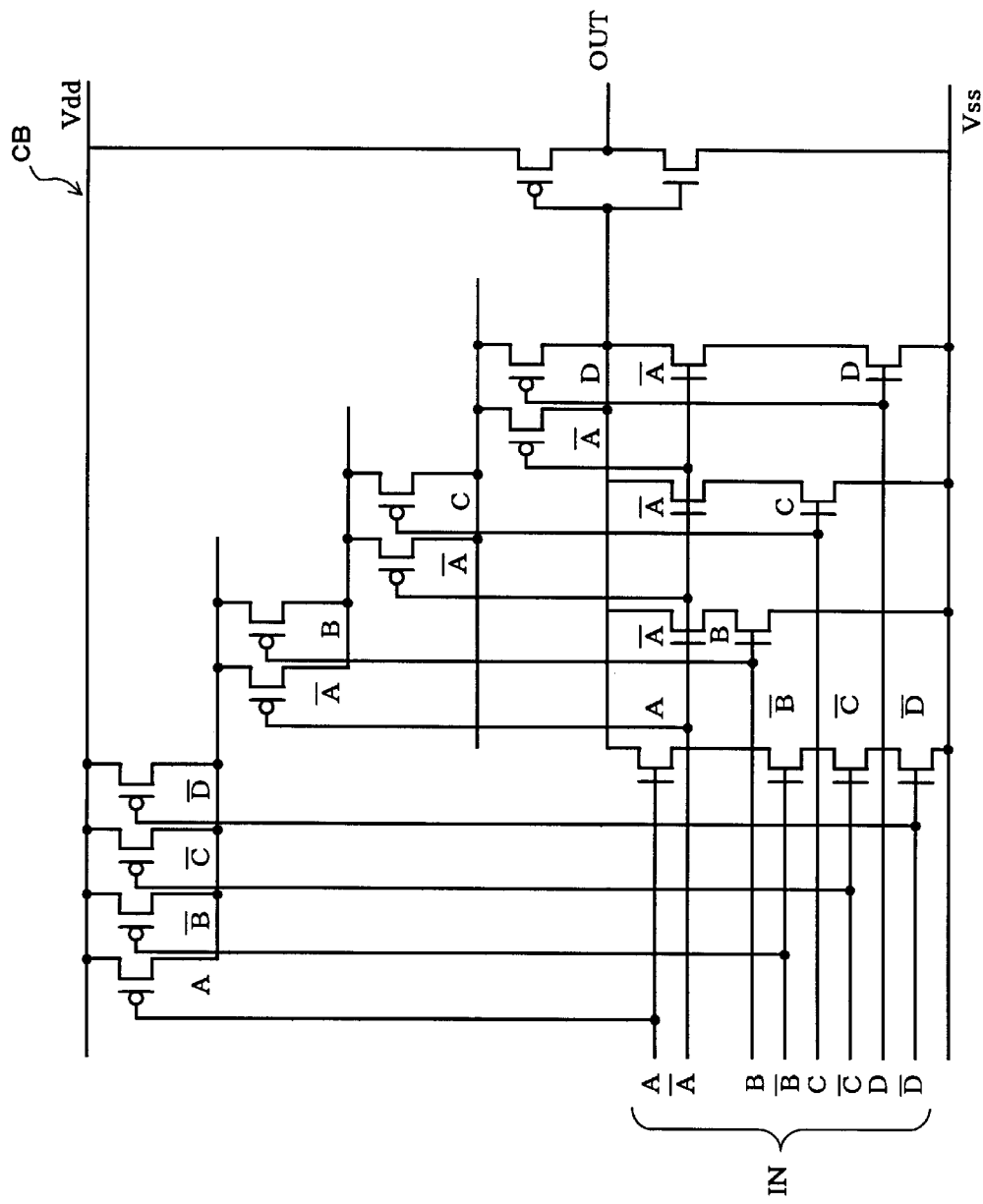
FIG. 22 is a view illustrating one example of the circuit operated under the truth table shown in FIG. 21A with logic gates by using CMOSs.

FIG. 21A is a truth table showing the operating conditions of the circuit shown in FIG. 20. FIG. 21B is a view illustrating logic gates operated under the truth table shown in FIG. 21A. FIG. 22 is a view illustrating one example of the circuit operated under the truth table shown in FIG. 21A with logic gates by using CMOSs.

It is understood that the number of elements (a total of 10 elements) used in the block CB is much less than that (a total of 22 elements) used in the block CB designed under conventional design criteria. The reason why the number of elements used in the block CB in FIG. 20 is less than that of the block shown in FIG. 22 is as the followings. Although, only two terminals (drain and gate) of a field effect transistor (FET) are used as a path for logic processing in the block using the conventional design rule criteria, a total of three terminals (source, drain and gate) of an FET are used fully as the path for logic processing in the block CB using the new design concept so called "path-logic".

Decreasing the number of elements used in the block CB can lower the power consumption.

Figure 25:
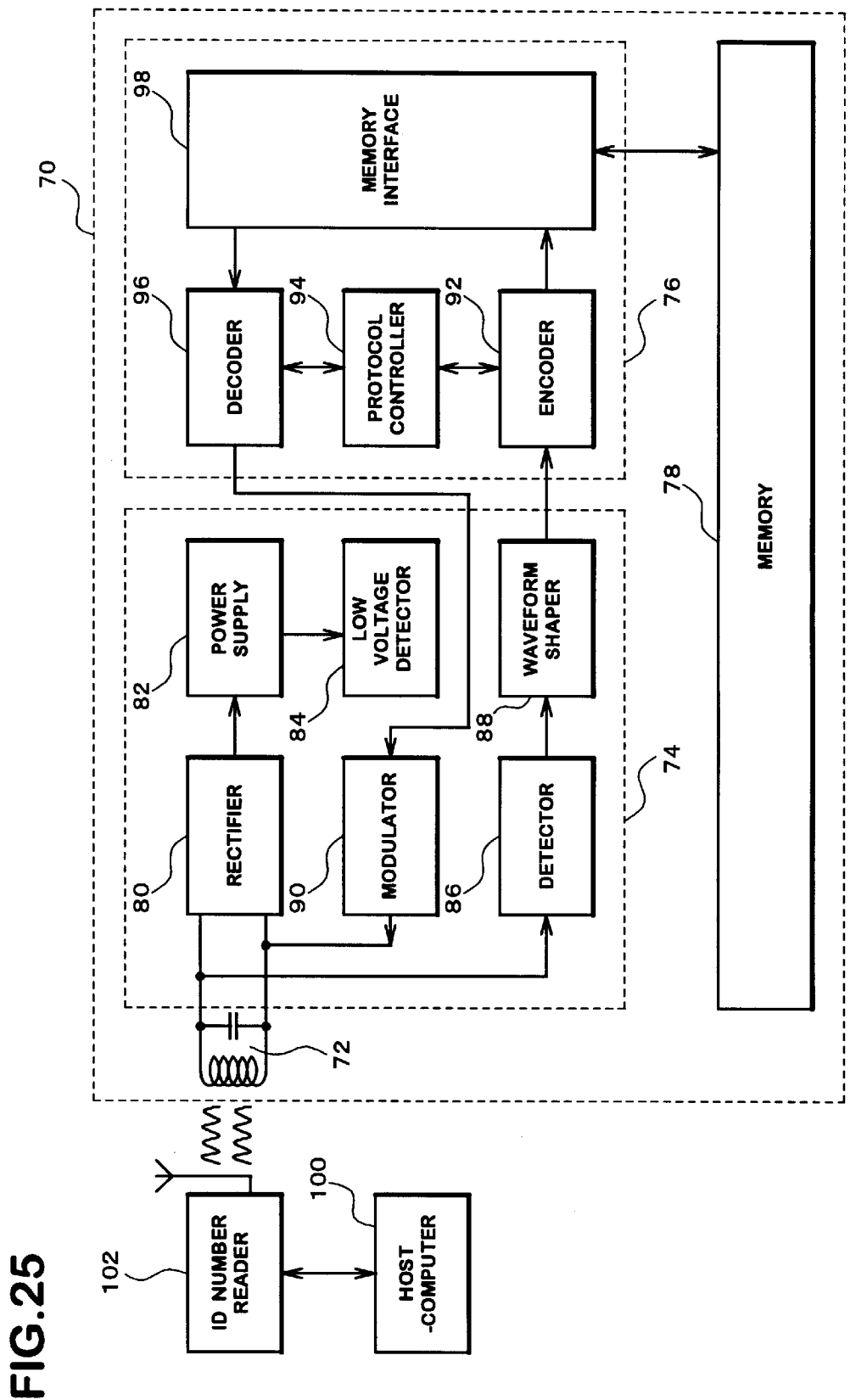
FIG. 25 is a block diagram of an IC card using the semiconductor devices described in the embodiments according to the present invention.

FIG. 25 is a block diagram of an IC card using the semiconductor devices described in the embodiments according to the present invention. The IC card is used for credit cards, and identification tag in distributing systems. Recently, both of contact type IC cards and non-contact type IC cards are available. Here, a non-contact type IC card 70 is described as an example of employing the present invention.

The IC card 70 comprises an antenna 72, an analog processor 74, a digital processor 76, and a memory 78. The IC card 70 is designed so as to communicate the followings with an identification (ID) number reader 102 connected to the host computer 100 over radio waves: 1) the electric power consumed thereby, 2) data communication.

The analog processor 74 includes a rectifier 80, a power supply 82, a low voltage detector 84, a detector 86, a waveform shaper 88, and a modulator 90. The digital processor 76 comprises an encoder 92, a protocol controller 94, a decoder 96, and a memory interface 98.

The memory 78 consists of a ferroelectric memory circuit using one of ferroelectric transistor(s) and ferroelectric capacitor(s). The memory 78 is preferable for the non contact type IC card 70 because of the following features; no power supply only for maintaining data is required, fast data writing is achieved, and no high voltage is required.

Radio waves inputted in the antenna 72 are rectified with the rectifier 80, and the radio waves thus rectified are sent to the power supply 82 and used as the power consumed within the IC card 70. The low voltage detector 84 detects degradation of the power supply voltage. In accordance with the output of the detector 84, for example, the transmission gate GT3 (see FIG. 9) is switched as described earlier.

The radio waves inputted through the antenna 72 are also detected with the detector 86 and shaped by the waveform shaper 88.

The encoder 92 performs an appropriate processing to the output data from the shaper 88 in accordance with a command from the protocol controller 94. If necessary, reading out data/data storing from/to the memory 78 is carried out though the memory interface 98 in accordance with the data thus processed.

The decoder 96 decodes the data and the like read out from the memory 78 and sends them to the modulator 90 in accordance with a command from the protocol controller 94. The modulator 90 modulates the data and transmits them from the antenna 72 as radio waves.

The host computer 100 reads the data on the radio waves through the number reader 102. In this way, data communication between the host computer 100 and the IC card 70 is carried out.

The semiconductor devices in each of the above embodiments are used for producing the digital processor 76 in the IC card 70. The semiconductor devices in each of the above embodiments may be used for producing a logic processing circuit of a microprocessor if the digital processor 76 is made of the microprocessor(s).

Further, the semiconductor devices in the embodiments may also be used for producing the sequence logic circuit used in a logic large-scale integrated circuit (LSI) if the digital processor 76 is made of the logic LSI(s).

Although, a dedicated LSI may be used for the logic LSI, a general use gate array can also be used for the logic LSI. In that case, a gate array comprising a transistor such as FET, an element composed of ferroelectrics such as a ferroelectric transistor or a ferroelectric capacitor may be used as the general use gate array.

Although, the non-contact type IC card is described as an example of the IC card using a semiconductor device according to the present invention in the above embodiment, IC cards using the semiconductor device employing the present invention is not limited to the IC card. The present invention may also be applied to contact type IC cards as well as IC cards capable of being used in both contact type/non-contact type IC cards and similar devices.

The semiconductor device according to the present invention is not limited to use for IC cards. The semiconductor device according to the present invention may further be applied to gate arrays such as field programmable gate array (FPGA), dynamic programmable gate array (FPGA) and similar gate arrays, computer hardware such as dedicated LSIs, microprocessors, and general use of semiconductor devices.

The signal storing circuit according to the present invention is characterized in that, the circuit comprises:

a signal path for passing the signal therethrough; and a ferroelectric memorizing portion connected to the signal path and holding a polarization-State corresponding to a signal on the signal path in an operation-State even after shut off the circuit while reproducing the signal on the signal path in accordance with the polarization-State thus held therein when the circuit is again in operation.

It is, therefore, the ferroelectric memorizing portion holds a signal in a form of Polarization-State corresponding to the signal on the signal path. In this way, the data is stored in the ferroelectric memorizing portion even when the power supply is shut off.

As a consequence, the current state of the ferroelectric memorizing portion can be made to the previous State, which is right, before the shut-off of the power supply quickly with certainty by using the data held therein when the power supply is in recovery. In other words, resulting data and the like can be stored therein even when the power supply is shut off.

Also, the signal storing circuit according to the present invention is characterized in that, a circular signal path including a main signal path and a feedback signal path is provided to a part of the signal path, and the ferroelectric memorizing portion is connected to at least one of the main signal path and the feedback signal path.

In this way, providing the feedback signal path to the circuit can further stabilize routine operations and the operation carried out at the recovery of the power supply.

Further, the signal storing circuit according to the present invention is characterized in that, a ferroelectric transistor is used as the ferroelectric memorizing portion.

In this way, a signal storing circuit having a longer life can easily be realized as a result of achieving nondestructive read-out of data.

Still further, the signal storing circuit according to the present invention is characterized in that, the ferroelectric transistor includes;

A) a source region and a drain region both of a first conductive type formed in a semiconductor substrate, B) a channel formation region of a second conductive type disposed between the source region and the drain region, C) an insulation layer located on the channel formation region, D) a first conductive layer disposed on the insulation layer, E) a ferroelectric layer located on the first conductive layer, and F) a second conductive layer disposed on the ferroelectric layer.

It is, therefore, the signal storing circuit can easily be manufactured by just carrying out additional step for forming both the ferroelectic layer and the second conductive layer during the manufacturing procedures of a conventional CMOSFET.

Yet further, the signal storing circuit according to the present invention is characterized in that, inverter circuits are provided respectively to the main signal path and the feedback signal path, and at least one of the inverter circuits is composed of a ferroelectric memorizing portion using the ferroelectric transistor.

In this way, the signal on the signal path can be held in the ferroelectric transistor composing the inverter circuit.

The signal storing circuit according to the present invention is characterized in that, an input gate carrying out switching operations in accordance with a predetermined gate control signal, is provided to the signal path at a position closer to an input terminal than a position connecting the circular signal path thereto.

In this way, stabilized outputs may be obtained by eliminating noises even when the noises are contained in the output data from the combined logic circuit.

Also, the signal storing circuit according to the present invention is characterized in that, an inverter circuit is provided to the main signal path, and wherein a predetermined reference electric potential is applied to an input terminal of the inverter circuit through a switching circuit including a control input terminal, and wherein the control input terminal is connected to an output terminal of the inverter circuit through the feedback signal path, and wherein at least one of the inverter circuit and the switching circuit is composed of the ferroelectric memorizing portion using a ferroelectric transistor.

In this way, the ferroelectric memorizing portion holds the signal provided on the bus line in a polarization form corresponding to the signal when the signal path is the bus line. In other words, the signal and the like on the bus line can be stored even when the power supply is shut off.

Further, the signal storing circuit according to the present invention is characterized in that, the ferroelectric memorizing portion is provided solely to the feedback signal path.

It is, therefore, transmission speed of signals in the circuit can be accelerated during the non-latching State thereof not by providing a ferroelectric transistor to the main signal path.

Still further, the signal storing circuit according to the present invention is characterized in that, a feedback gate by which the feedback signal path is shut off when the signal is delivered through the main signal path and the feedback signal path is connected each other when the signal is fed over the feedback signal path.

In this way, power consumption of the logic processing circuit can be decreased during non-latching State thereof by shut the feedback line off.

Yet further, the signal storing circuit according to the present invention is characterized in that, a ferroelectric capacitor is used as the ferroelectric memorizing portion.

As a consequence, a signal storing circuit having a high reliability can be realized by utilizing a ferroelectric capacitor capable of outputting reliable outputs.

The signal storing circuit according to the present invention is characterized in that, an input gate carrying out switching operations in accordance with a predetermined gate control signal and an output gate performing opposite switching operations to the input gate, are provided in series to the signal path, and wherein one end of the ferroelectric capacitor is connected to the signal path at a position between the input gate and the output gate while applying a voltage synchronized with the gate control signal to the other end of the ferroelectric capacitor.

In this way, a signal storing circuit capable of connecting the bus line can easily be realized by connecting the signal path and the bus line through the output gate.

Also, the signal storing circuit according to the present invention is characterized in that, a memory gate which carries out one of connection and disconnection between the signal path and the ferroelectric memorizing portion, is provided.

It is, therefore, possible to shut off the connection between the signal path and the ferroelectric memorizing portion with the memory gate when required. Consequently, the circuit is able to free from unintended variation of the Polarization State in the ferroelectric memorizing portion caused by signals on the signal path.

Further, the signal storing circuit according to the present invention is characterized in that, the memory gate carries out one of connection and disconnection between the signal path and the ferroelectric memorizing portion correspondingly with variations of power supply voltages.

In this way, the circuit is able to free from unintended variation of the Polarization State in the ferroelectric memorizing portion caused by undesirable variation of the power supply voltage such degradation thereof.

Still further, the signal storing circuit according to the present invention is characterized in that, a power control part which carries out one of switching and controlling electric power supplied to the signal storing circuit, is provided.

In this way, power consumption of the circuit can be suppressed as a result of shut-off the power supplied or limiting the power supplied in a small amount to a block not under operation by the control part. In this case, the ferroelectric memorizing portion keep holding its polarization-State even when the power supplied to the circuit is shut off. The structure described above is preferred because a signal corresponding to the Polarization-State can be provided to the signal path when the power supply is turned ON again.

Yet further, the signal storing circuit according to the present invention is characterized in that, the signal storing circuit is connected to a combined circuit through the signal path.

In this way, sequential processing having a high reliability and other related can be performed by utilizing the logic processing circuit including the combined circuit and a nonvolatile signal storing circuit.

The signal storing circuit according to the present invention is characterized in that, the combined circuit is a low-power consumption type circuit.

It is, therefore, energy saving may further be accelerated by using a low-power consumption type combination circuit such as a power controllable combination circuit or a combination circuit including fewer number of elements and equivalent.

Also, the semiconductor device according to the present invention is characterized in that, the semiconductor device includes the signal storing circuit and the combined circuit being connected thereto.

In this way, a semiconductor device capable of performing the following features: 1) holding the resulting data and the like even after the power supply provided thereto is shut off, and /or 2) consuming a lower-power, can be realized.

Further, the semiconductor device according to the present invention is characterized in that, the semiconductor device further comprises a ferroelectric memory circuit.

It is, therefore, the memory circuit may also be formed as a nonvolatile memory in the semiconductor device requiring a memory circuit. Consequently, a semiconductor having much higher energy saving efficiency can be realized.

Still further, the semiconductor device according to the present invention is characterized in that, the semiconductor device is a microcomputer.

In this way, a microcomputer capable of performing the following features: 1) holding the resulting data and the like even after the power supply provided thereto is shut off, and/or 2) consuming a lower-power, can be realized.

Yet further, the semiconductor device according to the present invention is characterized in that, the semiconductor device is formed by using a gate array.

It is, therefore, a semiconductor device capable of performing the following features: 1) holding the resulting data and the like even after the power supply provided thereto is shut off, and /or 2) consuming a lower-power, can easily be realized. In addition, the semiconductor device may be modified to a hardware element having different functions by changing the connection of the gate array.

The gate array according to the present invention is characterized in that, the gate array comprises a transistor, and an element composed of ferroelectrics.

In this way, a semiconductor device capable of performing the following features: 1) holding the resulting data and the like even after the power supply provided thereto is shut off, and 2) consuming a lower-power, can easily be realized by combining the transistor and the element composed of ferroelectrics.

Also, the IC card according to the present invention is characterized in that, the IC card uses the semiconductor devices defined in any one of the aforementioned claims.

It is, therefore, the IC card is advantageous especially used for a non-contact type IC card to which a lower electric power is supplied unstable basis because the resulting data and the like can bet stored in the IC card even after the power supply provided thereto is shut off. In addition, the IC card described above is preferred because it consumes less power than a conventional IC card.

While the embodiments of the present invention, as disclosed herein, constitute preferred forms, it is to be understood that each term was used as illustrative and not restrictive, and can be changed within the scope of the claims without departing from the scope and spirit of the invention.

What is claimed is:

1. A signal storing circuit storing a signal therein for a predetermined time period, the circuit comprising:

a signal path for passing the signal therethrough; and a ferroelectric memorizing portion connected to the signal path for storing a polarization-state corresponding to the signal on the signal path in an operation-state when the circuit is shut off and for reproducing the signal on the signal path in accordance with the polarization-state being held therein when the circuit is recovered, by using hysteresis of ferroelectrics of the ferroelectric memorizing portion.

2. The circuit according to claim 1, wherein the signal path has a circular signal path including a main signal path and a feedback signal path, and wherein the ferroelectric memorizing portion is connected to at least on of the main signal path and the feedback signal path.

3. The circuit according to claim 2, wherein the ferroelectric memorizing portion includes a ferroelectric transistor.

4. The circuit according to claim 3, wherein the ferroelectric transistor includes;

A) a source region and a drain region both of a first conductive type formed in a semiconductor substrate, B) a channel formation region of a second conductive type disposed between the source region and the drain region, C) an insulation layer located on the channel formation region, D) a first conductive layer disposed on the insulation layer, E) a ferroelectric layer located on the first conductive layer, and F) a second conductive layer disposed on the ferroelectric layer.

5. The circuit according to claim 3, wherein inverter circuits are provided respectively to the main signal path and the feedback signal path, and wherein at least one of the inverter circuits is composed of the ferroelectric memorizing portion including the ferroelectric transistor.

6. The circuit according to claim 2, wherein an input gate carrying out switching operations in accordance with a predetermined gate control signal, is provided to the signal path at a position closer to an input terminal than a position connecting the circular signal path thereto.

7. The circuit according to claim 3, wherein an inverter circuit is provided to the main signal path, and wherein a predetermined reference electric potential is applied to an input terminal of the inverter circuit through a switching circuit including a control input terminal, and wherein the control input terminal is connected to an output terminal of the inverter circuit through the feedback signal path, and wherein at least one of the inverter circuit and the switching circuit is composed of the ferroelectric memorizing portion including the ferroelectric transistor.

8. The circuit according to claim 2, wherein the ferroelectric memorizing portion is provided solely to the feedback signal path.

9. The circuit according to claim 2, wherein the circuit includes a feedback gate by which the feedback signal path is shut off when the signal is delivered through the main signal path and the feedback signal path is connected each other when the signal is fed over the feedback signal path.

10. The circuit according to claim 1, wherein the ferroelectric memorizing portion includes a ferroelectric capacitor.

11. The circuit according to claim 10, wherein an input gate carrying out switching operations in accordance with a predetermined gate control signal and an output gate performing opposite switching operations to the input gate, are provided in series to the signal path, and wherein one end of the ferroelectric capacitor is connected to the signal path at a position between the input gate and the output gate while applying a voltage synchronized with the gate control signal to the other end of the ferroelectric capacitor.

12. The circuit according to claim 1, wherein a memory gate which carries out one of connection and disconnection between the signal path and the ferroelectric memorizing portion, is provided.

13. The circuit according to claim 12, wherein the memory gate carries out one of connection and disconnection between the signal path and the ferroelectric memorizing portion correspondingly with variations of power supply voltages.

14. The circuit according to claim 1, wherein a power control part which carries out one of switching and controlling electric power supplied to the signal storing circuit, is provided.

15. The circuit according to claim 1, wherein the signal storing circuit is connected to a combined circuit through the signal path.

16. The circuit according to claim 15, wherein the combined circuit is a low-power consumption type circuit.

17. A semiconductor device comprising:
   a signal storing circuit storing a signal therein for a predetermined time period, the signal storing circuit further includes:
      a signal path for passing the signal therethrough; and
      a ferroelectric memorizing portion connected to the signal path for storing a polarization-state corresponding to the signal on the signal path in an operation-state when the circuit is shut off and for reproducing the signal on the signal path in accordance with the polarization-state being held therein when the circuit is turned on later, by using hysteresis of ferroelectrics of the ferroelectric memorizing portion; and
   a combined circuit connecting to the signal storing circuit through the signal path.

18. The semiconductor device according to claim 17 further comprising a ferroelectric memory circuit.

19. The semiconductor device according to claim 17, wherein the semiconductor device is a microcomputer.

20. The semiconductor device according to claim 17, wherein the semiconductor device is formed by using a gate array.

21. The semiconductor device according to claim 20, wherein the gate array further comprising:
   a transistor, and
   an element composed of ferroelectrics.

22. An IC card having a semiconductor device, which comprises:
   a signal storing circuit storing a signal therein for a predetermined time period, the signal storing circuit further includes:
      a signal path for passing the signal therethrough; and
      a ferroelectric memorizing portion connected to the signal path for storing a polarization-state corresponding to the signal on the signal path in an operation-state when the circuit is shut off and for reproducing the signal on the signal path in accordance with the polarization-state being held therein when the circuit is turned on later, by using hysteresis of ferroelectrics of the ferroelectric memorizing portion; and
   a combined circuit connecting to the signal storing circuit through the signal path.

* * * * *